(12) United States Patent
Wallis

(10) Patent No.: US 10,211,795 B2
(45) Date of Patent: Feb. 19, 2019

(54) IMPEDANCE TRANSFORMATION CIRCUIT AND OVERLOAD PROTECTION FOR LOW NOISE AMPLIFIER

(71) Applicant: Skyworks Solutions, Inc., Woburn, MA (US)

(72) Inventor: Leslie Paul Wallis, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/654,050

(22) Filed: Jul. 19, 2017

(65) Prior Publication Data

US 2018/0026592 A1  Jan. 25, 2018

Related U.S. Application Data

(60) Provisional application No. 62/365,218, filed on Jul. 21, 2016.

(51) Int. Cl.
*H03F 1/52* (2006.01)
*H03F 3/195* (2006.01)
(Continued)

(52) U.S. Cl.
CPC ............ *H03F 3/195* (2013.01); *H01L 23/66* (2013.01); *H03F 1/223* (2013.01); *H03F 1/347* (2013.01); *H03F 1/523* (2013.01); *H03F 1/565* (2013.01); *H04B 1/005* (2013.01); *H04B 1/1607* (2013.01); *H01L 23/5227* (2013.01); *H01L 23/60* (2013.01); *H01L 2223/6611* (2013.01); *H01L 2223/6655* (2013.01); *H01L 2224/04042* (2013.01); *H01L 2224/16227* (2013.01);
(Continued)

(58) Field of Classification Search
CPC ....... H03F 1/52; H03F 2200/117; H03F 1/523
USPC .................................................... 330/79, 298
See application file for complete search history.

(56) References Cited

U.S. PATENT DOCUMENTS 4,122,403 A   10/1978  Cave
4,159,450 A    6/1979  Hoover
(Continued)

FOREIGN PATENT DOCUMENTS

JP   2008-054260 A   3/2008

OTHER PUBLICATIONS

Wikipedia contributors, "Common source," *Wikipedia, The Free Encyclopedia*. Wikipedia, https://en.wikipedia.org/wiki/Common_source (accessed: Jun. 28, 2017).
(Continued)

*Primary Examiner* — Steven J Mottola
(74) *Attorney, Agent, or Firm* — Knobbe Martens Olson & Bear LLP

(57) ABSTRACT

Aspects of this disclosure relate to an impedance transformation circuit and overload protection for a low noise amplifier. A low noise amplifier can include a first inductor, an amplification circuit configured to amplify a radio frequency signal, and a second inductor magnetically coupled to the first inductor to provide negative feedback to linearize the low noise amplifier. A switch can be coupled to the amplification circuit of the low noise amplifier. An overload protection circuit can adjust an impedance of the switch based on a signal level associated with the radio frequency signal to provide overload protection for the low noise amplifier.

20 Claims, 16 Drawing Sheets

(51) Int. Cl.
*H04B 1/16* (2006.01)
*H03F 1/56* (2006.01)
*H01L 23/66* (2006.01)
*H04B 1/00* (2006.01)
*H03F 1/22* (2006.01)
*H03F 1/34* (2006.01)
*H01L 23/522* (2006.01)
*H01L 23/60* (2006.01)

(52) U.S. Cl.
CPC ............ *H01L 2224/48091* (2013.01); *H01L 2224/48227* (2013.01); *H01L 2224/73265* (2013.01); *H01L 2924/15313* (2013.01); *H01L 2924/19041* (2013.01); *H01L 2924/19042* (2013.01); *H01L 2924/19105* (2013.01); *H03F 2200/294* (2013.01); *H03F 2200/426* (2013.01)

(56) References Cited

U.S. PATENT DOCUMENTS

| | | |
|---|---|---|
| 4,859,967 A | 8/1989 | Swanson |
| 5,847,610 A | 12/1998 | Fujita |
| 6,188,277 B1 | 2/2001 | Borodulin et al. |
| 6,549,077 B1 | 4/2003 | Jou |
| 6,744,310 B2 | 6/2004 | Honda |
| 6,977,552 B2 | 12/2005 | Macedo |
| 7,348,854 B1 | 3/2008 | Mordkovich |
| 7,515,000 B1 | 4/2009 | Jin et al. |
| 7,911,269 B2 | 3/2011 | Yang et al. |
| 8,362,840 B2 | 1/2013 | Andrys et al. |
| 8,610,503 B2 | 12/2013 | Kaczman et al. |
| 9,595,926 B2 | 3/2017 | Quaglietta |
| 9,825,597 B2 | 11/2017 | Wallis |
| 2002/0067205 A1 | 6/2002 | Aparin et al. |
| 2007/0046376 A1 | 3/2007 | Van Der Heijden |
| 2008/0239597 A1* | 10/2008 | Van Bezooijen ......... H03F 1/52 361/56 |
| 2010/0233975 A1 | 9/2010 | Wu et al. |
| 2010/0237947 A1 | 9/2010 | Xiong et al. |
| 2011/0018635 A1 | 1/2011 | Tasic et al. |
| 2011/0291765 A1 | 12/2011 | Sun et al. |
| 2011/0292554 A1 | 12/2011 | Yao et al. |
| 2013/0009704 A1 | 1/2013 | Liao |
| 2013/0331043 A1 | 12/2013 | Perumana et al. |
| 2014/0015614 A1 | 1/2014 | Oliveira et al. |
| 2014/0253242 A1 | 9/2014 | Youssef et al. |
| 2014/0266461 A1 | 9/2014 | Youssef et al. |
| 2014/0348274 A1 | 11/2014 | Youssef et al. |
| 2015/0035600 A1 | 2/2015 | Jin et al. |
| 2016/0094192 A1 | 3/2016 | Khesbak et al. |
| 2016/0164476 A1 | 6/2016 | Wang et al. |
| 2017/0194918 A1 | 7/2017 | Wallis |

OTHER PUBLICATIONS

Wikipedia contributors, "Common emitter," *Wikipedia, The Free Encyclopedia*. Wikipedia, https://en.wikipedia.org/wiki/Common_emitter (accessed: Jun. 28, 2017).

* cited by examiner

IMPEDANCE TRANSFORMATION CIRCUIT AND OVERLOAD PROTECTION FOR LOW NOISE AMPLIFIER

CROSS REFERENCE TO PRIORITY APPLICATION

This application claims the benefit of priority under 35 U.S.C. § 119(e) of U.S. Provisional Patent Application No. 62/365,218, filed Jul. 21, 2016 and titled "IMPEDANCE TRANSFORMATION CIRCUIT AND OVERLOAD PROTECTION FOR LOW NOISE AMPLIFIER," the disclosure of which is hereby incorporated by reference in its entirety herein.

BACKGROUND

Technical Field

Embodiments of this disclosure relate to electronic systems and, in particular, to radio frequency (RF) electronics.

Description of Related Technology

A low noise amplifier (LNA) can receive a radio frequency (RF) signal from an antenna. The LNA can be used to boost the amplitude of a relatively weak RF signal. Thereafter, the boosted RF signal can be used for a variety of purposes, including, for example, driving a switch, a mixer, and/or a filter in an RF system.

LNAs can be included in a variety of applications, such as base stations or mobile devices, to amplify signals of a relatively wide range of frequencies. For example, a low noise amplifier (LNA) can be used to provide low noise amplification to RF signals in a frequency range of about 30 kHz to 300 GHz.

SUMMARY OF CERTAIN INVENTIVE ASPECTS

The innovations described in the claims each have several features, no single one of which is solely responsible for its desirable attributes. Without limiting the scope of the claims, some prominent features of this disclosure will now be briefly described.

One aspect of this disclosure is a low noise amplifier system that includes a low noise amplifier, a switch, and an overload protection circuit. The low noise amplifier includes a first inductor, an amplification circuit configured to amplify a radio frequency signal, and a second inductor magnetically coupled to the first inductor to provide negative feedback to linearize the low noise amplifier. The switch is coupled to the amplification circuit. The overload protection circuit is configured to adjust an impedance of the switch based on a signal level associated with the radio frequency signal to provide overload protection for the low noise amplifier.

The switch can be an input switch configured to provide the radio frequency signal to the amplification circuit for amplification. The overload protection circuit can provide a feedback signal to an analog control input of the input switch to adjust the impedance of the input switch. The overload protection circuit can increase the impedance of the input switch responsive to detecting that the signal level indicates an overload condition. The low noise amplifier system can also include limiter enable circuit coupled between an output of the overload protection circuit and the analog control input of the input switch, in which the overload protection circuit is configured to provide the feedback signal to the analog control input by way of the limiter enable circuit. The limiter enable circuit can receive a switch enable signal and disconnect the output of the overload protection circuit from the analog control input and turn off the input switch responsive to the switch enable signal being disabled. The input switch can include a field effect transistor having a gate configured as the analog control input.

The signal level can be an output signal level of the low noise amplifier. Alternatively, the signal level can be an input signal level of the low noise amplifier.

The overload protection circuit can include a detector and an error amplifier. The detector can generate a detection signal based on detecting the signal level. The error amplifier can generate a feedback signal for the switch based on the detection signal. The detector can include a bipolar transistor configured to saturate in response to an overload condition of the low noise amplifier. The detector can include a capacitor configured to filter a current flowing through the bipolar transistor, and the detector can generate the detection signal based on a voltage across the capacitor. The detection signal can include a detection current. The error amplifier can generate the feedback signal based on amplifying a difference between the detection current and a reference current.

The switch can provide the radio frequency signal to the amplification circuit by way of a matching circuit that includes the first inductor. The matching circuit can include a direct current blocking capacitor and a series inductor in series between the direct current blocking capacitor and the first inductor. The direct current blocking capacitor, the series inductor, and the first inductor can be arranged in series between the switch and a control terminal of the amplification circuit.

The first inductor and the second inductor can together function as a transformer having a primary winding in series with an input of the amplification circuit and a secondary winding connected between a transistor of the amplification circuit and a low voltage reference. The second inductor can be configured as a degeneration inductor. The switch can be in series with the second inductor. For instance, the second inductor can be in arranged in series between the switch and the amplification circuit.

The amplification circuit can include a field effect transistor having a source, and the second inductor can be configured as a source degeneration inductor. The first inductor and the second inductor can together function as a transformer having a primary winding in series with a gate of the field effect transistor and a secondary winding connected at the source of the field effect transistor.

The amplification circuit can include a bipolar transistor having an emitter, and the second inductor is configured as an emitter degeneration inductor. The first inductor and the second inductor can together function as a transformer having a primary winding in series with a base of the bipolar transistor and a secondary winding connected at the emitter of the bipolar transistor.

The low noise amplifier system can include a series inductor arranged in series between the switch and the first inductor. The low noise amplifier system can include a direct current blocking capacitor electrically connected between the switch and the series inductor. The low noise amplifier system can include a shunt capacitor electrically connected to a node between the switch and the series inductor.

Another aspect of this disclosure is a front end system comprising that includes a low noise amplifier, an input switch, and an overload protection circuit. The low noise amplifier includes a first inductor, an amplification circuit configured to receive a radio frequency signal by way of the first inductor and to amplify the radio frequency signal, and a second inductor magnetically coupled to the first inductor to provide negative feedback to linearize the low noise amplifier. The input switch has a control input arranged to control an impedance of the input switch. The input switch includes a first throw coupled to the first inductor. The overload protection circuit is configured to provide a feedback signal to the control input of the input switch based on based on a signal level associated with the low noise amplifier.

The front end system can include a bypass path. The input switch can include a second throw electrically connected to the bypass path. The front end system can further include a power amplifier. The input switch can further include a third throw electrically connected to the power amplifier. The low noise amplifier, the bypass path, the multi-throw switch, and the power amplifier can be embodied on a single die.

The front end system can include an output switch having at least a first throw electrically connected to an output of the low noise amplifier.

The input switch can electrically connect an input of the low noise amplifier to an antenna in a first state.

The low noise amplifier, the input switch, and the overload protection circuit can be embodied on a single die.

The front end system can include a package enclosing the low noise amplifier, the input switch, and the overload protection circuit.

In the front end system, the control input can be an analog input.

The front end system can include one or more suitable features of any of the low noise amplifier systems discussed herein.

Another aspect of this disclosure is a wireless communication device that includes a front end system and an antenna in communication with the front end system. The front end system comprising that includes a low noise amplifier, an input switch, and an overload protection circuit. The low noise amplifier includes a first inductor, an amplification circuit configured to receive a radio frequency signal by way of the first inductor and to amplify the radio frequency signal, and a second inductor magnetically coupled to the first inductor to provide negative feedback to linearize the low noise amplifier. The input switch has a control input arranged to control an impedance of the input switch. The input switch includes a first throw coupled to the first inductor. The overload protection circuit is configured to provide a feedback signal to the control input of the input switch based on based on a signal level associated with the low noise amplifier.

The front end system can be configured to process Bluetooth signals. The front end system can be configured to process ZigBee signals. The front end system can be configured to process Wi-Fi signals.

The front end system can include one or more suitable features of any of the front end systems discussed herein.

The wireless communication device can be a mobile phone. The wireless communication device can be configured for wireless communication over a personal area network.

Another aspect of this disclosure is a method of providing overload protection in a low noise amplifier system. The method includes amplifying a radio frequency signal using the low noise amplifier, the low noise amplifier including first and second inductors magnetically coupled to each other to provide negative feedback to linearize the low noise amplifier; detecting that a signal level associated with the low noise amplifier is indicative of an overload condition; and increasing an impedance of a switch coupled to an amplification circuit of the low noise amplifier responsive to said detecting to thereby provide overload protection.

Detecting the signal level can include detecting an output signal level of the low noise amplifier. Alternatively, detecting the signal level can include detecting an input signal level of the low noise amplifier.

The switch can be an input switch configured to provide the radio frequency signal to the low noise amplifier. The method can include selectively connecting an output of an overload protection circuit to an analog control input of the input switch. The method can also include disconnecting the output of the overload protection circuit from the analog control input responsive to a switch enable signal being disabled.

The method can include generating a feedback signal based on detecting the signal level associated with the low noise amplifier using an error amplifier of the overload protection circuit, in which increasing the impedance of the switch is responsive to the feedback signal. Detecting can include generating a detection current. Generating the feedback signal can include amplifying a difference between the detection current and a reference current.

Detecting the signal level can include saturating a bipolar transistor in response to the overload condition. Detecting the signal level can also include filtering a current flowing through the bipolar transistor using a capacitor and controlling the detected signal level based on a voltage across the capacitor.

The switch can include a field effect transistor. Increasing the impedance of the switch can include providing an analog signal to a gate of the field effect transistor.

The second inductor can be a source degeneration inductor. Alternatively, the second inductor can be an emitter degeneration inductor. The switch can be arranged in series with the second inductor.

The switch can be an input switch configured to provide the radio frequency signal to the low noise amplifier. A series inductor can be arranged in series between the input switch and the first inductor. The method can include blocking a direct current signal component associated with the radio frequency signal using a blocking capacitor electrically connected between the input switch and the series inductor. A shunt capacitor can be electrically connected to a node between the input switch and the series inductor.

The present disclosure relates to U.S. patent application Ser. No. 15/389,097, titled "IMPEDANCE TRANSFORMATION CIRCUIT FOR AMPLIFIER," filed on Dec. 22, 2016, the entire disclosure of which is hereby incorporated by reference herein. The present disclosure relates to U.S. patent application Ser. No. 15/458,423, titled "APPARATUS AND METHODS FOR OVERLOAD PROTECTION OF LOW NOISE AMPLIFIERS," filed on Mar. 14, 2017, the entire disclosure of which is hereby incorporated by reference herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
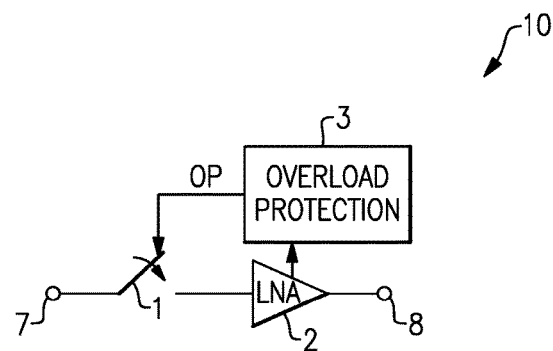
FIG. 1 is a schematic diagram of a low noise amplifier (LNA) system according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

Overload Protection for Low Noise Amplifiers

Large input signals can cause overload conditions to arise in a low noise amplifier (LNA). For example, in certain applications, an LNA is specified to tolerate a high overload signal that is substantially higher than a normal operating signal level. Overload protection can provide protection from signals having a high current and/or a high voltage.

Absent an overload protection scheme, providing a large input signal to an LNA can result in high current and/or voltage manifesting in circuitry of the LNA, such as transistors of the LNA used for amplification. Such high current and/or voltage can cause permanent electrical overstress damage to the amplification transistors such that they are no longer able to operate and/or such that their operation is impaired. An overload event can alternatively or additionally damage circuit elements that are electrically connected to an output of the LNA.

Apparatus and methods for overload protection of LNAs are provided herein. In certain configurations, an LNA system includes an input switch having an analog control input that controls an impedance of the input switch, an LNA that amplifies a radio frequency (RF) input signal received from the input switch, and an overload protection circuit that provides feedback to the input switch's analog control input based on detecting a signal level of the LNA. The overload protection circuit detects whether or not the LNA is overloaded. Additionally, when the overload protection circuit detects an overload condition, the overload protection circuit provides feedback to the analog control input of the switch to increase the impedance of the switch and reduce the magnitude of the RF input signal received by the LNA.

The overload protection schemes described herein can be used to limit large current and/or voltage swing conditions manifesting within circuitry of an LNA.

In certain implementations, the input switch is also used for controlling signal connectivity and/or routing. For example, the input switch can be part of a multi-throw switch used to facilitate routing of signals transmitted and received via an antenna. Using the input switch for both overload protection and signal routing can reduce overhead and/or enhance performance by sharing circuitry for multiple functions. For example, using an input switch that is already in a receive signal path provides overload protection without increasing the insertion loss of the receive path. Thus, the overload protection circuit has no or a relatively small impact on the LNA's performance.

The teachings related to overdrive protection discussed herein can be used to control the impedance of an input switch to attenuate an incoming RF signal to a safe level. For an input switch, such as a metal-oxide-semiconductor (MOS) transistor switch, an analog control input can be used to control the input switch's impedance. For example, the impedance of a MOS transistor switch can be controlled based on a voltage level provided to the MOS transistor's gate.

In certain implementations described herein, the overload protection circuit controls the analog control input of the input switch with an overload protection signal that is based on a detected signal level of the LNA, such as an input signal level, an internal signal level, and/or output signal level. Additionally, the overload protection circuit can provide feedback to the input switch's analog control input via the overload protection signal to prevent a large input signal from damaging the LNA.

In certain configurations, the impedance of the input switch can be controlled based not only on the overload protection signal from the overload protection circuit, but also on one or more digital control signals. For example, in certain implementations, the overload protection circuit includes a limiter enable circuit connected between an output of the overload protection circuit and the analog control input to the input switch. The limiter enable circuit controls the input switch based on one or more digital control signals, such as a switch enable signal and/or limiter enable signal. For example, the limiter enable circuit can be used to disconnect the overload protection circuit from the analog control input when the input switch is in an off state and/or when overload protection is disabled.

In certain configurations, the impedance of the input switch can be controlled based not only on the overload protection signal from the overload protection circuit, but also on one or more digital control signals. For example, in certain implementations, the overload protection circuit includes a limiter enable circuit connected between an output of the overload protection circuit and the analog control input to the input switch. The limiter enable circuit controls the input switch based on one or more digital control signals, such as a switch enable signal and/or limiter enable signal. For example, the limiter enable circuit can be used to disconnect the overload protection circuit from the analog control input when the input switch is in an off state and/or when overload protection is disabled. In contrast, detection at the LNA's input may degrade noise figure.

Detection at the output also relaxes design constraints of the detector, since the output signal level is higher than the input signal level.

In certain implementations, the LNA includes an output rectifier circuit that clips or limits an output voltage level of the LNA. Including the output rectifier circuit can enhance performance, since the output rectifier circuit can have a faster turn-on time relative to a time taken by feedback from the overload protection circuit to increase the impedance of the input switch. In one example, the output rectifier is implemented using clamping diodes. Once the overload protection circuit's control loop responds to provide feedback, the signal level is turned down or decreased to a safe level via control of the impedance of the input switch.

A network or circuit connected in shunt with a signal path can impact overall noise or linearity performance. By providing overload protection using an input switch already present, the LNA need not include an additional circuit in shunt or series to protect against overload.

The overload protection circuits described herein can provide signal attenuation at the LNA's input via increasing impedance of the input switch. Accordingly, the overload protection schemes discussed herein can be used to protect against both high voltage and high current. Furthermore, reducing the RF input signal to the LNA protects all circuitry of the LNA. In contrast, an implementation using only an output voltage clamp may not fully protect certain circuits of the LNA and/or high currents may nevertheless flow in the LNA when clamping.

The LNA overload protection schemes disclosed herein are applicable to a wide variety of RF systems, including, but not limited to, smartphones, base stations, handsets, wearable electronics, and/or tablet computers.

FIG. 1 is a schematic diagram of an LNA system 10 according to one embodiment. The LNA system 10 includes an input switch 1, an LNA 2, and an overload protection circuit or signal limiter 3. The LNA system 10 further includes an input terminal 7 and an output terminal 8.

The LNA 2 provides amplification to an RF input signal received from the input terminal 7 via the input switch 1. The LNA 2 provides an amplified RF output signal on the output terminal 8. In certain configurations, the input terminal 7 is electrically connected to an antenna and the output terminal 8 is electrically connected to a transceiver. For instance, the transceiver can include a demodulator that downconverts the amplified RF output signal from the LNA 2 to baseband or an intermediate frequency.

The input switch 1 includes an analog control input used to control the input switch's impedance between the input terminal 7 and an input to the LNA 2. In certain configurations, the input switch 1 includes at least one metal-oxide-semiconductor (MOS) transistor having a gate that serves as the analog control input. By controlling an analog gate voltage of the MOS transistor, an impedance of the input switch can be controlled.

As shown in FIG. 1, the overload protection circuit 3 detects a signal level of the LNA 2 to determine whether or not an overload condition is present. Additionally, the overload protection circuit 3 generates an overload protection signal OP operable to provide feedback to the analog control input of the switch 1. When the overload protection circuit 3 detects an overload condition, the overload protection circuit 3 increases the impedance of the input switch 1, thereby reducing the magnitude of the RF input signal received by the LNA 2. Thus, the overload protection circuit 3 serves as a signal limiter that limits large current and voltage swing conditions manifesting within amplification transistors of the LNA 2.

In certain implementations, the input switch 1 corresponds to part of a multi-throw switch used to facilitate routing of signals transmitted and/or received via an antenna. For example, the input terminal 7 can be connected to an antenna of a wireless communication device. Using the input switch 1 for both overload protection and routing signals can reduce overhead and/or enhance performance. Thus, during normal signaling conditions when no overload condition is present, the overload protection circuit 3 has no impact or a relatively small impact on the performance of the LNA 2. For instance, since the input switch 1 is included for signal routing, the overload protection scheme need not increase an insertion loss between the input terminal 7 and the output terminal 8.

Although not illustrated in FIG. 1, the LNA system 10 can include other components and/or circuitry. For example, in one embodiment, the LNA system 10 further includes a limiter enable circuit connected between an output of the overload protection circuit 3 and the analog control input to the input switch 1. In certain implementations, the limiter enable circuit can be used to selectively connect the output of the overload protection circuit 3 and the input switch's analog control input based on a state of a switch enable signal.

Figure 2A:
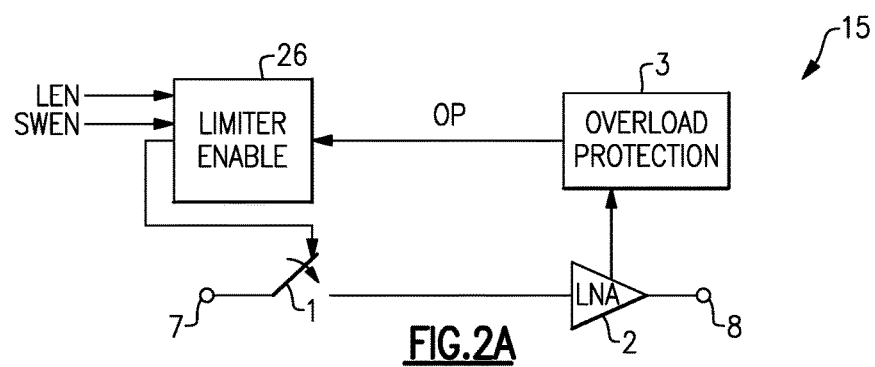
FIG. 2A is a schematic diagram of an LNA system according to another embodiment.

FIG. 2A is a schematic diagram of an LNA system 15 according to another embodiment. The LNA system 15 of FIG. 2A includes the input terminal 7, the output terminal 8, the input switch 1, the LNA 2, and the overload protection circuit 3, which can be as described earlier. The LNA system 15 further includes a limiter enable circuit 26.

The LNA system 15 of FIG. 2A is similar to the LNA system 10 of FIG. 1, except that the LNA system 15 further includes the limiter enable circuit 26. As shown in FIG. 2A, the limiter enable circuit 26 receives a limiter enable signal LEN and a switch enable signal SWEN, in this embodiment. Although FIG. 2A illustrates one example of digital control signals for a limiter enable circuit, other implementations are possible.

The limiter enable circuit 26 receives the overload protection signal OP from the overload protection circuit 3. The limiter enable signal LEN can be used to selectively enable overload protection/signal limiter functionality based on a state of digital control signals received by the limiter enable circuit 26.

In the illustrated embodiment, when the switch enable signal SWEN and limiter enable signal LEN are enabled, the limiter enable circuit 26 provides the overload protection signal OP to the analog control input of the input switch 1. However, when the switch enable signal SWEN is disabled, the limiter enable circuit 26 controls the analog control input to turn off the input switch 1. Additionally, when the limiter enable signal LEN is disabled, the input switch 1 can be turned on or off based on the state of the switch enable signal SWEN.

Including the limiter enable circuit 26 between the output of the overload protection circuit 3 and the analog control input of the input switch 1 provides a number of advantages. For example, the limiter enable circuit 26 allows the switch state to be controlled by a logic signal, while also allowing the overload protection circuit 3 to provide feedback to the input switch's analog control input when desired.

For example, when the switch enable signal SWEN is in a disabled state, the limiter enable circuit 26 disconnects the output of the overload protection circuit 3 from the analog control input and turns off the input switch 1. However, when the switch enable signal SWEN and the limiter enable signal LEN are in enabled states, the limiter enable circuit 26 connects the output of the overload protection circuit 3 to the analog control input of the input switch 1.

Figure 2B:
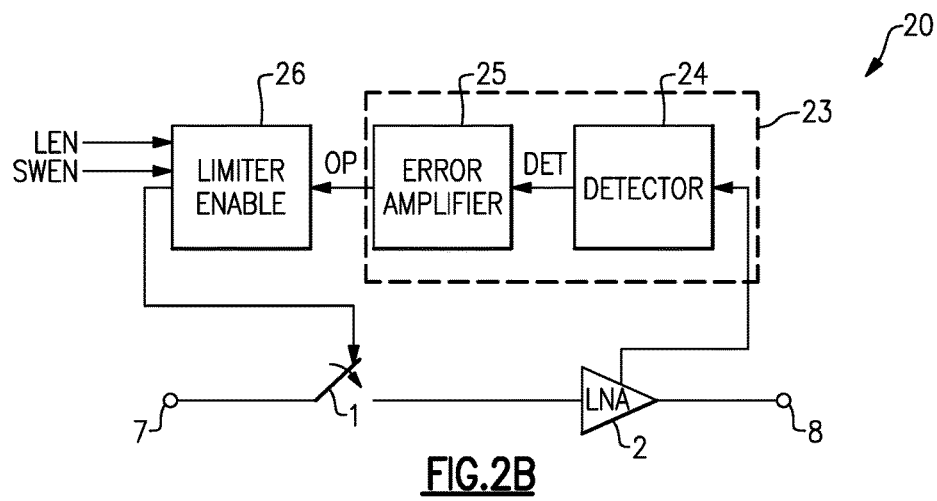
FIG. 2B is a schematic diagram of an LNA system according to another embodiment.

FIG. 2B is a schematic diagram of an LNA system 20 according to another embodiment. The LNA system 20 includes the input terminal 7, the output terminal 8, the input switch 1, the LNA 2, and the limiter enable circuit 26, which can be as described earlier. The LNA system 20 further includes an overload protection circuit or signal limiter 23.

The illustrated overload protection circuit 23 includes a detector 24 and an error amplifier 25. The detector 24 generates a detection signal DET based on detecting a signal level of the LNA 2. The detector 24 can sense the signal level of the LNA 2 in a wide variety of ways, including, for example, output signal detection, input signal detection, and/or detection of an intermediate voltage and/or current.

As shown in FIG. 2B, the error amplifier 25 amplifies the detection signal DET to generate an overload protection signal OP, which is provided to the limiter enable circuit 26. In certain implementations, the error amplifier 25 amplifies a difference between the detection signal DET and a reference signal.

Although FIG. 2B illustrates one embodiment of an overload protection circuit, the overload protection circuits herein can be implemented in a wide variety of ways.

Figure 3A:
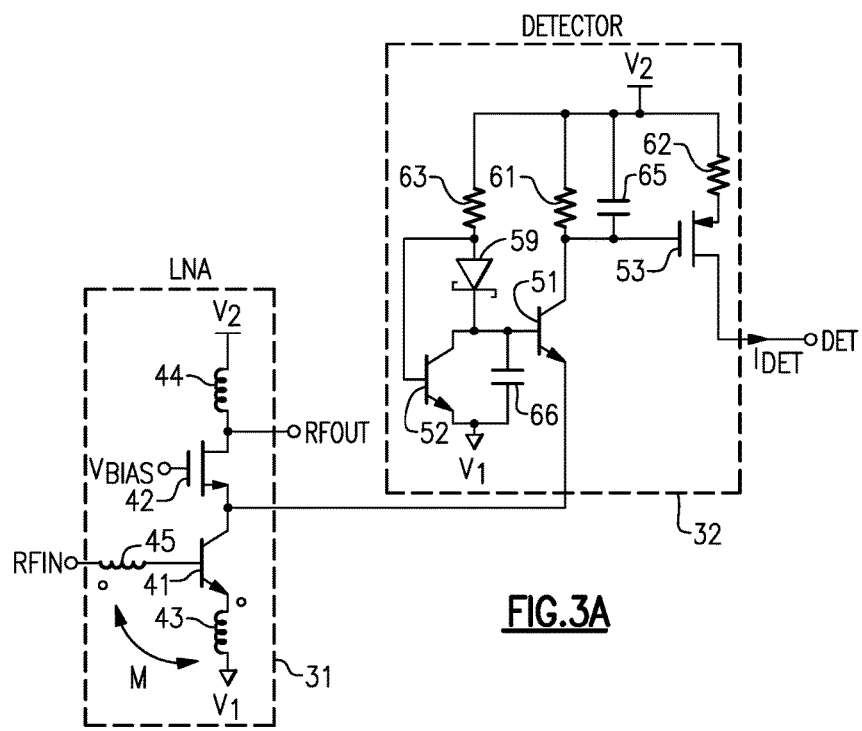
FIG. 3A is a schematic diagram of an LNA and a detector according to an embodiment.

FIG. 3A is a schematic diagram of an LNA 31 and a detector 32 according to one embodiment. The LNA 31 includes an LNA input RFIN and an LNA output RFOUT. The detector 32 includes a detector input coupled to an internal node of the LNA 31 and a detector output DET.

The LNA 31 further includes an amplification NPN transistor 41, a cascode n-type metal-oxide-semiconductor (NMOS) transistor 42, an emitter degeneration inductor 43, a biasing inductor 44, and an input inductor 45. Although one implementation of an LNA is shown in FIG. 3A, the teachings herein are applicable to LNAs implemented in a wide variety of ways, including but not limited to, LNAs using more or fewer transistors and/or transistors of different device types and/or polarities.

In FIG. 3A, the input inductor 45 and the emitter degeneration inductor 43 can together provide mutual inductance effects that can improve linearity of the LNA 31. The input inductor 45 and the emitter degeneration inductor 43 can together function as a transformer, with a primary winding in series with a base of the NPN transistor 41 and a secondary winding electrically connected at the emitter of the NPN transistor 41. As illustrated, the input inductor 45 is magnetically coupled with the emitter degeneration inductor 43. Accordingly, these inductors can provide negative feedback to linearize the LNA 31. The dot notation in FIG. 3 indicates the phase of magnetic coupling between the input inductor 45 and the emitter degeneration inductor 43.

As shown in FIG. 3A, the base of the amplification NPN transistor 41 is connect to the LNA input RFIN by way of the input inductor 45, and the collector of the amplification NPN transistor 41 is connected to a source of the cascode NMOS transistor 42. The emitter degeneration inductor 43 is electrically connected between an emitter of the amplification NPN transistor 41 and a first voltage $V_1$ (for instance, ground), and the biasing inductor 44 is electrically connected between a drain of the cascode NMOS transistor 42 and a second voltage $V_2$ (for instance, a power supply). The gate of the cascode NMOS transistor 42 is biased by a bias voltage $V_{BIAS}$ and the drain of the cascode NMOS transistor 42 is connected to the LNA output RFOUT. For clarity of the figures, bias circuitry of the LNA 31 has not been shown. However, the LNA 31 can be biased in a wide variety of ways.

The illustrated detector 32 includes a first detection NPN transistor 51, a second detection NPN transistor 52, a detection p-type metal-oxide-semiconductor (PMOS) transistor 53, a Schottky diode 59, a first resistor 61, a second resistor 62, a third resistor 63, a first capacitor 65, and a second capacitor 66. Although one implementation of a detector is shown in FIG. 3A, the teachings herein are applicable to detectors implemented in a wide variety of ways.

In the illustrated embodiment, the detector 32 generates a detection current $I_{DET}$ at the detector output DET. The magnitude of the detection current $I_{DET}$ is based on a detected signal level of the LNA 31, and in particular to a signal swing at the collector of the amplification NPN transistor 41. However, a signal detector can detect an LNA's signal level in other ways. Moreover, although the illustrated detector 32 generates a detection current, other configurations are possible, including but not limited to, implementations in which a detector generates a detection voltage.

At high signal power the voltage at the collector of the amplification NPN transistor 41 saturates the first detection NPN transistor 51, which gives rise to a flow of rectified current through the first detection NPN transistor 51. The rectified current is filtered by the first capacitor 65 to generate a voltage the controls a gate of the detection PMOS transistor 53. Thus, when the LNA 31 is in overload, a detection current $I_{DET}$ flows from the detector 32.

The illustrated embodiment depicts one implementation of an LNA and detector suitable for use in an LNA system, such as the LNA system 20 of FIG. 2B. Although FIG. 3A illustrates one embodiment of an LNA and detector, the teachings herein are applicable to LNAs and detectors implemented in a wide variety of ways.

Figure 3B:
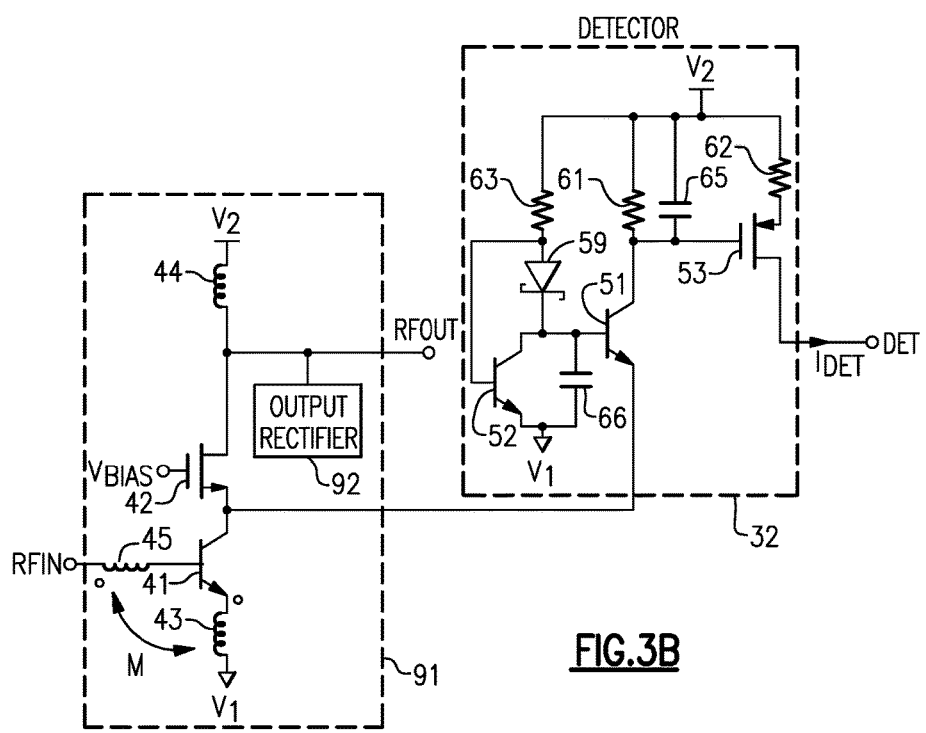
FIG. 3B is a schematic diagram of an LNA and a detector according to an embodiment.

FIG. 3B is a schematic diagram of an LNA 91 and a detector 32 according to another embodiment. The schematic diagram of FIG. 3B is similar to the schematic diagram of FIG. 3A, except that the LNA 91 of FIG. 3B further includes an output rectifier circuit 92 electrically connected to the LNA output RFOUT.

In certain implementations, such as the embodiment of FIG. 3B, an LNA is protected not only using an overload protection circuit that provides feedback to an input switch, but also using an output rectifier circuit 92 that clips or limits an output voltage level of the LNA. Including the output rectifier circuit 92 can enhance performance, since the output rectifier circuit 92 can have a faster turn-on time relative to a time taken by feedback from the overload protection circuit to increase the impedance of the input switch. Once the overload protection circuit's control loop responds to provide feedback, the signal level is turned down or decreased to a safe level via control of the impedance of the input switch.

In one embodiment, the output rectifier circuit 92 is implemented using clamping diodes. For example, the output rectifier can include one or more diode networks electrically connected between the LNA output RFOUT and one or more reference voltages, for instance, between the LNA output RFOUT and the first voltage $V_1$ and/or between the LNA output RFOUT and the second voltage $V_2$.

Figure 4:
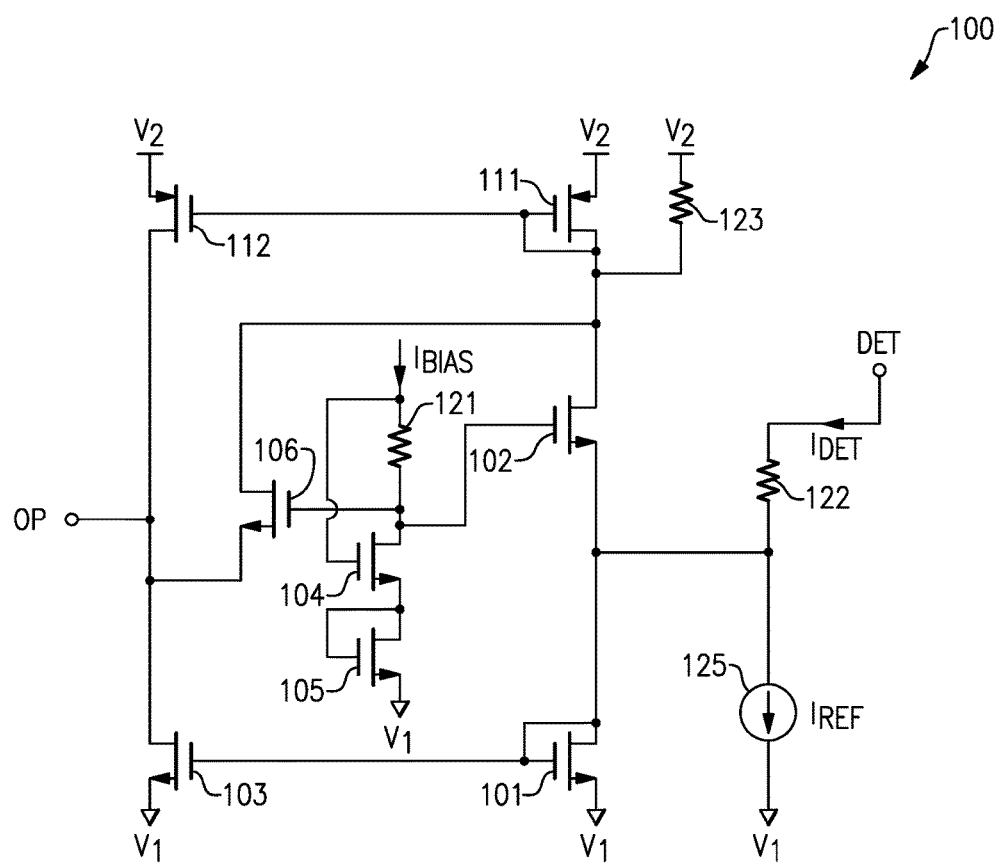
FIG. 4 is a schematic diagram of an error amplifier according to an embodiment.

FIG. 4 is a schematic diagram of an error amplifier 100 according to one embodiment. The error amplifier 100 includes a first NMOS transistor 101, a second NMOS transistor 102, a third NMOS transistor 103, a fourth NMOS transistor 104, a fifth NMOS transistor 105, a sixth NMOS transistor 106, a first PMOS transistor 111, a second PMOS transistor 112, a first resistor 121, a second resistor 122, a third resistor 123, and a reference current source 125. The error amplifier 100 includes a detection input DET for receiving a detection signal from a detector. The error amplifier 100 further includes an overload protection output OP, which can be used to control an analog control input of an input switch.

In the illustrated embodiment, a detection current $I_{DET}$ from a detector (for example, the detector 32 of FIGS. 3A-3B) is received by the error amplifier 100. When the detection current $I_{DET}$ is greater than the reference current $I_{REF}$ of the reference current source 125, the second NMOS transistor 102 can turn off and the first NMOS transistor 101 can conduct. Since the first and third NMOS transistors 101, 103 operate as a first current mirror and the first and second PMOS transistors 111, 112 operate as a second current mirror, the overload protection output OP is pulled down when the detection current $I_{DET}$ is greater than the reference current $I_{REF}$.

The first resistor 121 aids in preventing the first and second NMOS transistors 101, 102 from simultaneously conducting. For example, the first resistor 121 operates in conjunction with the fourth and fifth NMOS transistors 104, 105 to bias the first and second NMOS transistors 101, 102 near conduction, while inhibiting simultaneously conduction. This in turn prevents a continuously linear closed loop when the error amplifier 100 is connected in a feedback loop from an LNA to an analog control input of an input switch. As shown in FIG. 4, a bias current $I_{BIAS}$ is used to bias the first resistor 121 and the fourth and fifth NMOS transistors 104, 105.

At very high input power to an LNA, a detector can generate a relatively large detection signal, which can result in the overload protection output OP being controlled to the first voltage $V_1$. At intermediate input power levels, the circuit can exhibit blocking oscillator behavior. In certain implementations, there is no continuous linear signal path around the loop, but instead a switched oscillatory behavior.

In certain implementations, the feedback signal generated at the overload protection output OP can be provided to a limiter enable circuit (for example, the limiter enable circuit 26 of FIGS. 2A-2B), which in turn can selectively provide the feedback signal to an analog control input of an input switch. When a large input signal is present during an overload condition, the overload protection output OP goes low (in this embodiment), which in can turn off the input switch either fully or partially.

For example, the input switch includes an analog control input, and thus the magnitude of the input signal to an LNA can be controlled using the overload protection output OP. Since turning off the input switch partially reduces the input signal strength to the LNA and a corresponding value of the detector signal DET, a closed loop is provided. The closed loop exhibits different behavior at different input power levels. At very high power, the input switch is fully off and substantially no input signal is provided to the LNA. At intermediate power levels, when the loop exhibits some oscillatory behavior, the overload protection output OP can operate at a DC level with a superimposed AC component. In certain implementations, the input switch filters the AC component, since the input switch can be implemented to have a time constant lower than the period of the oscillatory signal. Accordingly, the loop can behave as though it were under linear control.

In certain configurations, the loop does not respond to any signal levels encountered in normal operation, only to higher overload conditions. The protection loop has a finite response time, and thus may not protect against instantaneous voltage peaks. However, the protection loop can limit total exposure of the LNA to high currents. In certain configurations, an LNA further includes an output rectifier to bolster protection against instantaneous voltage peaks.

In the illustrated embodiment, the overload protection output OP is normally high. However, when an overload condition is detected, the overload protection output OP is a continuously variable level, that can vary between the voltages of the first voltage $V_1$ and the second voltage $V_2$. The analog or continuous signal level of the overload protection output OP arises from the error amplifier 100 operating in a closed loop. The overload protection output OP is controlled to a voltage level that depends on an input power to the LNA and operating conditions, such as temperature.

The illustrated embodiment depicts one implementation of an error amplifier for use in an LNA system, such as the LNA system 20 of FIG. 2B. Although one embodiment of an error amplifier is shown in FIG. 4, an error amplifier can be implemented in other ways.

Figure 5A:
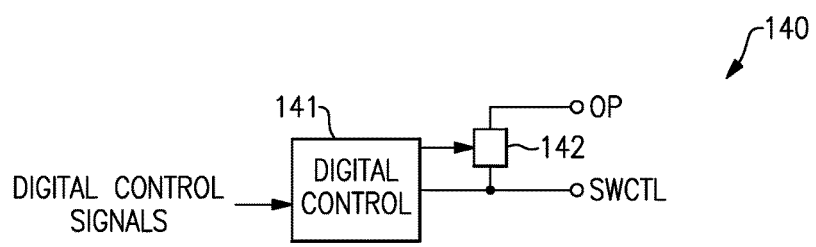
FIG. 5A is a schematic diagram of a limiter enable circuit according to one embodiment.

FIG. 5A is a schematic diagram of a limiter enable circuit 140 according to one embodiment. The limiter enable circuit 140 includes a digital control circuit 141 and a feedback enable circuit 142. The limiter enable circuit 140 receives an overload protection signal OP and one or more digital control signals, and generates a switch control signal SWCTL used to control an analog control input of an input switch, such as the input switch 1 of FIG. 1.

As shown in FIG. 5A, the digital control circuit 141 receives one or more digital control signals, which the digital control circuit 141 processes to control whether or not the feedback enable circuit 142 is turned on or off. When the feedback enable circuit 142 is turned on, the overload protection signal OP is used to control an analog voltage level of the switch control signal SWCTL. However, when feedback enable circuit 142 is turned off, the digital control circuit 141 digitally controls the switch control signal SWCTL.

Figure 5B:
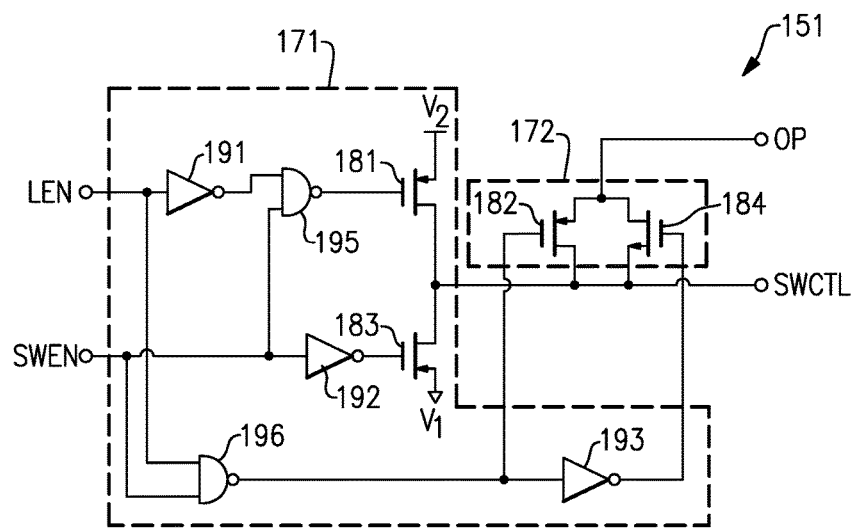
FIG. 5B is a schematic diagram of a limiter enable circuit according to another embodiment.

FIG. 5B is a schematic diagram of a limiter enable circuit 151 according to another embodiment. The limiter enable circuit 151 includes a digital control circuit 171 that includes a first inverter 191, a second inverter 192, a third inverter 193, a first NAND gate 195, a second NAND gate 196, a first PMOS transistor 181, and a first NMOS transistor 183. The limiter enable circuit 151 further includes a feedback enable circuit 172 that includes a second PMOS transistor 182 and a second NMOS transistor 184.

In the illustrated embodiment, the digital control circuit 171 receives a limiter enable signal LEN and a switch enable signal SWEN. The digital control circuit 171 controls whether or not the feedback enable circuit 172 is enabled based on a state of the limiter enable signal LEN and the switch enable signal SWEN, in this embodiment.

For example, in the illustrated embodiment, when the limiter enable signal LEN is logically low (corresponding to disabled, in this embodiment), the digital control circuit 171 turns off the feedback enable circuit 172 and digitally controls the switch control signal SWCTL to have the same state as the switch enable signal SWEN. Additionally, when the limiter enable signal LEN is logically low and the switch enable signal SWEN is logically low, the digital control circuit 171 shuts off the feedback enable circuit 172 and digitally controls the switch control signal SWCTL logically low, in this embodiment. However, when the limiter enable signal LEN and the switch enable signal SWEN are logically high, the digital control circuit 171 turns off the feedback enable circuit 172 and the overload protection signal OP controls the switch enable signal SWCTL.

Although FIG. 5B illustrates one embodiment of a limiter control circuit in accordance with the teachings herein, limiter control circuits can be implemented in a wide variety of ways. Moreover, the teachings herein are applicable to implementations in which a limiter control circuit is omitted.

Figure 5C:
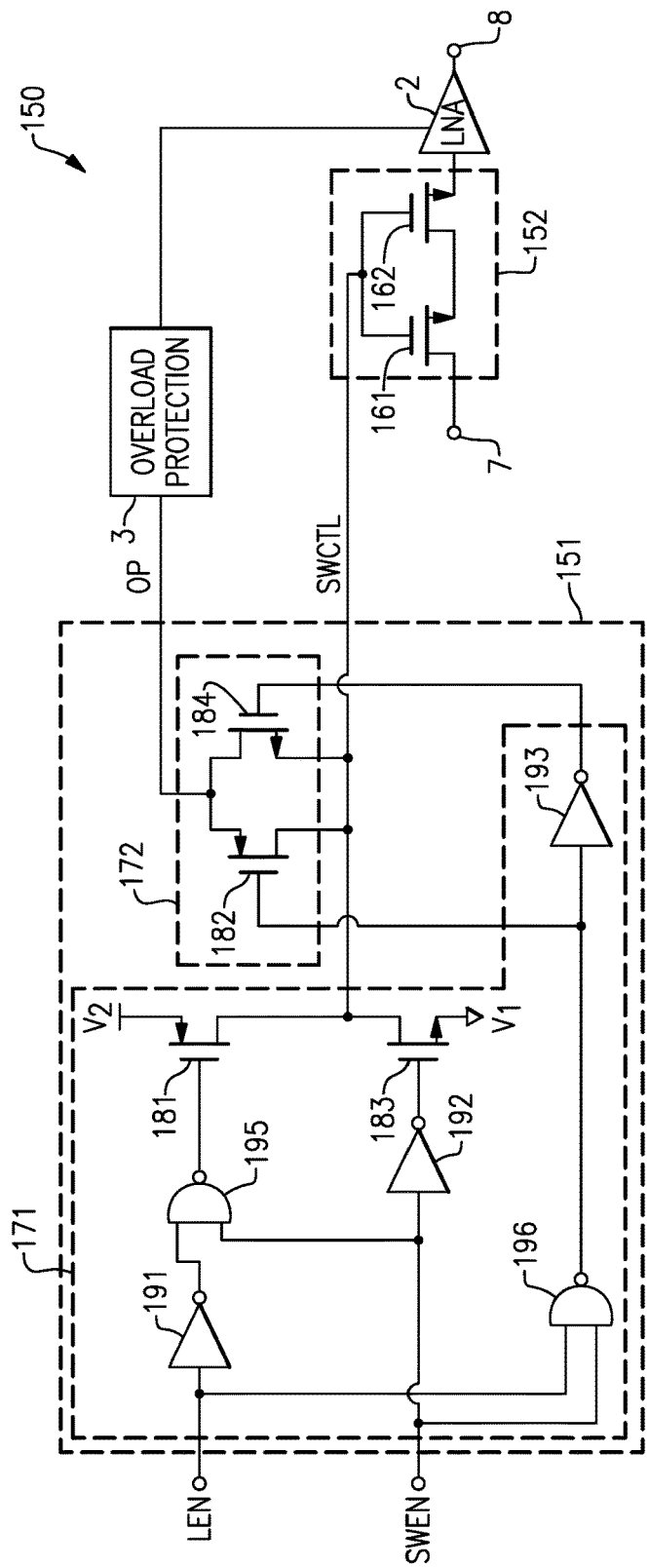
FIG. 5C is a schematic diagram of an LNA system according to another embodiment.

FIG. 5C is a schematic diagram of an LNA system 150 according to another embodiment. The LNA system 150 includes the input terminal 7, the output terminal 8, the LNA 2, the overload protection circuit 3, and the limiter enable circuit 151, which can be as described earlier. The LNA system 150 further includes an input switch 152.

The illustrated input switch 152 includes a first NMOS transistor 161 and a second NMOS transistor 162 electrically connected in series with one another. In the illustrated embodiment, the gates of the NMOS transistors 161, 162 serve as the analog control input to the input switch 152. Additionally, the RF input signals passes from the input terminal 7 to the input of the LNA 2 via the channels of the NMOS transistors 161, 162. Although one implementation of an input switch is shown, an input switch can be implemented in other ways.

As shown in FIG. 5C, the limiter enable circuit 151 is connected between an output of the overload protection circuit or limiter 3 and the analog control input to the input switch 152. The logic of the limiter enable circuit 151 is implemented to disconnect the overload protection circuit 3 from the analog control input when the switch enable signal SWEN and/or limiter enable signal LEN is disabled.

Thus, the overload protection circuit 3 controls the analog control input of the input switch 152 when the switch enable signal SWEN and limiter enable signal LEN are enabled. However, when the switch enable signal SWEN is disabled, the limiter enable circuit 151 can control the analog control input to the first voltage $V_1$ (for instance, ground or a negative voltage), to turn off the input switch 152. Additionally, the limiter enable signal LEN is used to disable overload protection/signal limiter functionality. Thus, when the limiter enable signal LEN is disabled, the input switch 152 can be turned on or off based on the state of the switch enable signal SWEN.

The switch enable signal SWEN and limiter enable LEN can be generated in a variety of ways. In certain configurations, an integrated circuit (IC) includes one or more registers used to control a state of the switch enable signal SWEN and/or limiter enable LEN. For example, the one or more registers can be programmed by a transceiver over an interface, such as a serial peripheral interface. However, the switch enable signal SWEN and/or limiter enable signal LEN can be generated in other ways, such as being provided via pins of the IC.

Additional details of the LNA system 150 can be as described herein.

Low Noise Amplifiers with Impedance Transformation

There are several performance parameters for any given low noise amplifier design to satisfy simultaneously. Supply current for a low noise amplifier is often pre-determined. In such circumstances, there are relatively few variables that can be manipulated to set the overall behavior of the low noise amplifier. This disclosure provides one more controlling variable to set the overall performance of the circuit. In particular, linearity can be improved by implementing features of this disclosure.

In a low noise amplifier (LNA), linearity can be a significant parameter. It can be desirable for an LNA to have a relatively high linearity. Linearity can be measured by a 1 dB compression point and/or a $3^{rd}$ order intermodulation. Accordingly, a 1 dB compression point and/or a 3rd order intermodulation of an LNA can be significant. Specifications for LNAs and other circuits are specifying higher linearity with lower supply current. This trend is expected to continue. Such specifications can be challenging to meet while also meeting other performance specifications. Accordingly, there is a need for LNAs with improved linearity.

This disclosure provides a new way to control the input match of an LNA, and in such a way the linearity of the LNA can be improved. For instance, using the principles and advantages discussed herein, the 1 dB compression point and 3rd order intermodulation can be improved. This disclosure provides circuits that can extend inductively degenerated amplifier concepts such that both self and mutual inductance effects can improve linearity of an LNA, instead of only self-inductive degeneration.

An LNA can include an inductively degenerated common source or common emitter amplifying device. The inductive degeneration can linearize such a circuit. In addition, the degeneration inductor can set the input impedance of the circuit in conjunction with the size and bias current of the amplifying device. A series input matching inductor at the input can be included to achieve a desired input impedance and obtain a relatively good input match.

Aspects of this disclosure relate to an LNA with magnetic coupling between a degeneration inductor (e.g., a source degeneration inductor or an emitter degeneration inductor) and a series input inductor. These magnetically coupled inductors can in effect provide a transformer, with a primary winding in series with the input and a secondary winding electrically connected where the degeneration inductor is electrically connected to the amplifying device (e.g., at the source of a field effect transistor amplifying device or at the emitter of a bipolar transistor amplifying device). The phase of the magnetic coupling can be significant. This phase is indicated by the dot notation in the accompanying drawings. With the magnetically coupled inductors disclosed herein, inductively degenerated amplifier concepts can be extended by using both self and mutual inductance.

In the LNAs discussed herein, several effects can occur at the same time. Typically, metal oxide semiconductor (MOS) LNAs have a voltage gain from the input of the circuit to a gate of the amplifying device. This voltage gain can degrade the 3rd order intermodulation (IIP3) performance of the circuit. An attenuator is typically not used to reduce signal amplitude because such an attenuator can undesirably degrade the noise performance of the circuit. The LNAs discussed herein can include a negative feedback circuit. An amplifying device of an LNA can receive a radio frequency (RF) signal by way of a first inductor that is magnetically coupled to a degeneration inductor. The first inductor can have a first end configured to receive the RF signal and a second end electrically coupled to the amplifying device. The impedance looking into a node at the first end of the first inductor (e.g., node n2 in FIGS. 7A to 7F) can be increased and the voltage at a node at the second end of the first inductor (e.g., node n3 in FIGS. 7A to 7F) can be decreased. This may not reduce the gain, but the effect can allow the circuit to be scaled differently, with a larger amplifying device. The higher input impedance can also allow the inductance of the input match inductor that provides the RF signal to the first inductor to have a lower value. This can be advantageous when an on chip match inductor is implemented, as the Q of such devices can be limited, and the effective series impedance of the input matching inductor can degrade the noise performance of the LNA. For instance, in one implementation, the input match inductor value is approximately half the value it would otherwise be without the magnetically coupled inductors. While the circuits discussed herein may not give the absolutely best possible noise match, the magnetically coupled inductors can allow the input match inductor to have a lower inductance and thereby recover at least some of the noise performance. The negative feedback provided by magnetically coupled inductors discussed herein can provide an amplifier with increased linearity.

One aspect of this disclosure is an impedance transformation circuit for use in an amplifier. The impedance transformation circuit includes a matching circuit including a first inductor. The impedance transformation circuit also includes a second inductor. The first and second inductors are magnetically coupled to each other to provide negative feedback to linearize the amplifier.

The second inductor can be a degeneration inductor, such as a source degeneration inductor or an emitter degeneration inductor. The first inductor can provide a radio frequency signal to an amplification circuit of the amplifier. The first inductor, the second inductor, and the amplification circuit of amplifier can be embodied on a single die.

The matching circuit can further include a series inductor having a first end and a second end, in which the first end is configured to receive a radio frequency signal, and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a low noise amplifier (LNA). The LNA includes a matching circuit including a first inductor, an amplification circuit configured to receive a radio frequency signal by way of the first inductor and to amplify the radio frequency signal, and a second inductor. The first and second inductors are magnetically coupled to each other to provide negative feedback to linearize the LNA.

The amplification circuit can include a common source amplifier or a common emitter amplifier. A cascode transistor can be arranged in series with either of these amplifiers. Such a cascode transistor can be a common drain amplifier or a common base amplifier. The second inductor can be a source degeneration inductor or an emitter degeneration inductor.

The first inductor, the second inductor, and the amplification circuit of amplifier are can be embodied on a single die. The matching circuit can further include a series inductor having a first end and a second end, in which the first end is configured to receive the radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a front end system that includes a low noise amplifier, a bypass path, and a multi-throw switch. The low noise amplifier includes a matching circuit including a first inductor, an amplification circuit configured to receive a radio frequency signal by way of the first inductor and to amplify the radio frequency signal, and a second inductor magnetically coupled with the first inductor to provide negative feedback to linearize the amplification circuit. The multi-throw switch has at least a first throw electrically connected to the low noise amplifier and a second throw electrically connected to the bypass path.

The front end system can further include a power amplifier. The multi-throw switch can have a third throw electrically coupled to the power amplifier. The low noise amplifier, the bypass path, the multi-throw switch, and the power amplifier can be embodied on a single die.

The front end system can further include a second multi-throw switch having at least a first throw electrically connected to the low noise amplifier and a second throw electrically connected to the bypass path, in which the low noise amplifier is included in a first signal path between the multi-throw switch and the second multi-throw switch, and in which the bypass path is included in a second signal path between the multi-throw switch and the second multi-throw switch.

The multi-throw switch can electrically connect an input of the low noise amplifier to an antenna in a first state, and the multi-throw switch can electrically connect the bypass path to the antenna in a second state. The front end system can further include the antenna. The antenna can be integrated with the low noise amplifier, the bypass path, and the multi-throw switch.

The low noise amplifier, the multi-throw switch, and the bypass path can be embodied on a single die. The front end system can include a package enclosing the low noise amplifier, the multi-throw switch, and the bypass path.

In the front end system, the LNA can include any suitable combination of features of the LNAs and/or amplifiers discussed herein.

FIGS. 6A to 6D illustrate example low noise amplifiers that include impedance transformation circuits with magnetically coupled inductors arranged to linearize the low noise amplifiers. Any of these low noise amplifiers can be implemented in a receive path in an RF system. The low noise amplifiers can be implemented by any suitable process technology, such as silicon-on-insulator. Any combination of features of the low noise amplifiers of FIGS. 6A to 6D can be implemented as suitable.

Figure 6A:
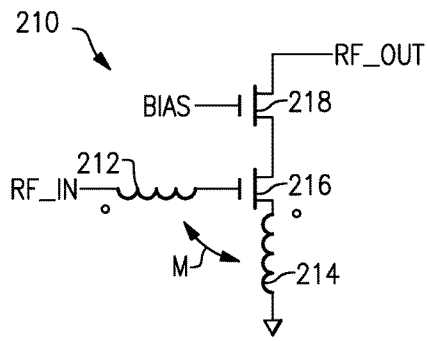
FIG. 6A is a schematic diagram of a low noise amplifier that includes field effect transistors and an impedance transformation circuit according to an embodiment.

FIG. 6A is a schematic diagram of a low noise amplifier (LNA) 210 that includes an impedance transformation circuit according to an embodiment. As illustrated, the LNA 210 includes an impedance transformation circuit and an amplification circuit. The illustrated impedance transformation circuit includes a first inductor 212 and a second inductor 214. The illustrated amplification circuit includes field effect transistors 216 and 218.

The second inductor 214 illustrated in FIG. 6A is a source degeneration inductor that can provide self-inductive degeneration. The first inductor 212 and the second inductor 214 can together provide mutual inductance effects that can improve linearity of the LNA 210. The first inductor 212 and the second inductor 214 can together function as a transformer, with a primary winding in series with a gate of the field effect transistor 216 and a secondary winding electrically connected at the source of the field effect transistor 216. As illustrated, the first inductor 212 is magnetically coupled with the second inductor 214. Accordingly, these inductors can provide negative feedback to linearize the LNA 210. The dot notation in FIG. 6A indicates the phase of magnetic coupling between the first inductor 212 and the second inductor 214.

The amplification circuit illustrated in FIG. 6A includes a common source amplifier 216 and a common gate amplifier 218. An RF input signal RF_IN can be provided to the gate of the common source amplifier 216 by way of the first inductor 212. As illustrated, the common gate amplifier 218 is arranged in series with the common source amplifier 216. Accordingly, the common gate amplifier 218 can be referred to as a cascode transistor or a cascode field effect transistor. A bias circuit can provide a bias signal BIAS to the gate of the common gate amplifier 218. The common gate amplifier 218 can provide an RF output signal RF_OUT.

Figure 6B:
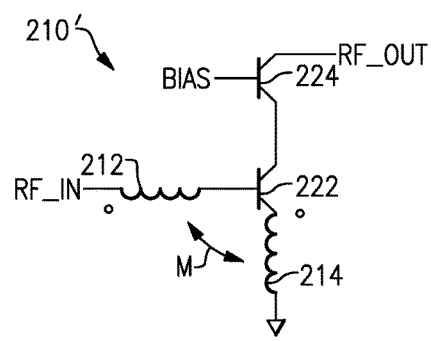
FIG. 6B is a schematic diagram of a low noise amplifier that includes bipolar transistors and an impedance transformation circuit according to an embodiment.

FIG. 6B is a schematic diagram of a low noise amplifier 210' that includes an impedance transformation circuit according to an embodiment. The low noise amplifier 210' of FIG. 6B is similar to the low noise amplifier 210 of FIG. 6A, except that the amplification circuit in FIG. 6B is implemented by bipolar transistors instead of field effect transistors. As illustrated in FIG. 6B, the amplification circuit includes bipolar transistors 222 and 224. The amplification circuit of FIG. 6B includes a common emitter amplifier 222 in series with a common base amplifier 224. The second inductor 214 of FIG. 6B is an emitter degeneration inductor.

Figure 6C:
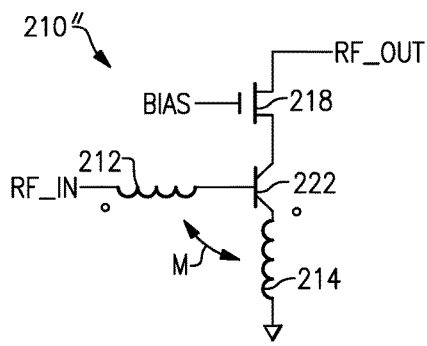
FIG. 6C is a schematic diagram of a low noise amplifier that includes a bipolar transistor, a field effect transistor and an impedance transformation circuit according to an embodiment.

FIG. 6C is a schematic diagram of a low noise amplifier 210" that includes an impedance transformation circuit according to an embodiment. An amplification circuit of an LNA can include a bipolar transistor and a field effect transistor. The bipolar transistor and the field effect transistor of such an LNA can be arranged in a stack. FIG. 6C illustrates an example of an LNA 210" that includes a bipolar transistor and a field effect transistor arranged in a stack. As illustrated in FIG. 6C, the LNA 210" includes a bipolar transistor 222 arranged as a common emitter amplifier and a cascode filed effect transistor 218 arranged as a common gate amplifier. Alternatively, a low noise amplifier can include a common source amplifier and a common base amplifier arranged in a stack.

Figure 6D:
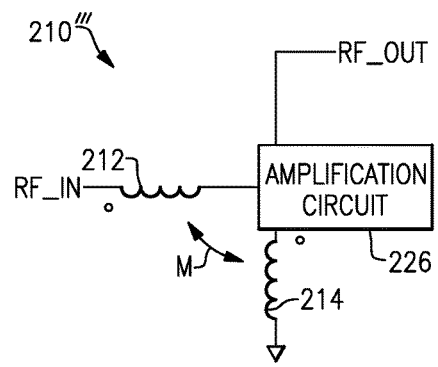
FIG. 6D is a schematic diagram of a low noise amplifier that includes an amplification circuit and an impedance transformation circuit according to an embodiment.

FIG. 6D is a schematic diagram of a low noise amplifier 210'" that includes an impedance transformation circuit according to an embodiment. The amplification circuits shown in FIGS. 6A to 6C are example amplification circuits that can be implemented in connection with an impedance transformation circuit that includes magnetically coupled inductors that provide negative feedback to linearize an LNA. FIG. 6D shows that the first inductor 212 and the second inductor 214 can be implemented in connection with any suitable amplification circuit, as shown by amplification circuit 226. The amplification circuit 226 can be implemented by the amplification circuit of FIG. 6A, the amplification circuit of FIG. 6B, the amplification circuit of FIG. 6C, or any other suitable amplification circuit.

Figure 7A:
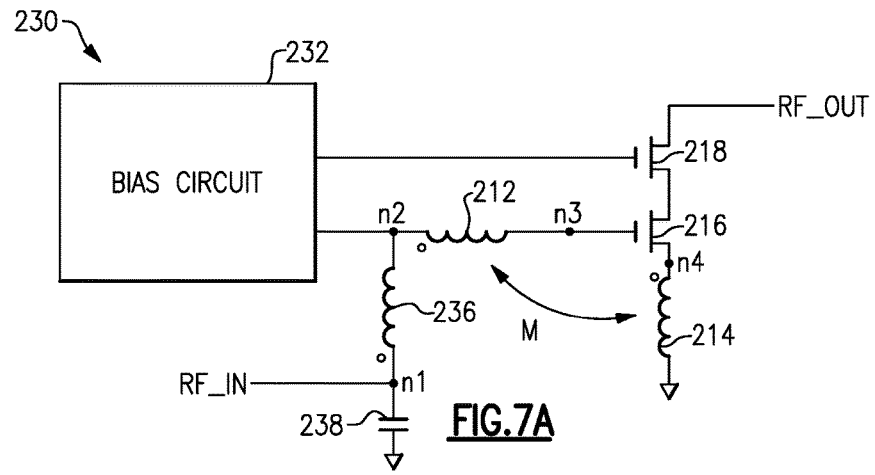
FIG. 7A is a schematic diagram that illustrates a low noise amplifier according to an embodiment.
Figure 7B:
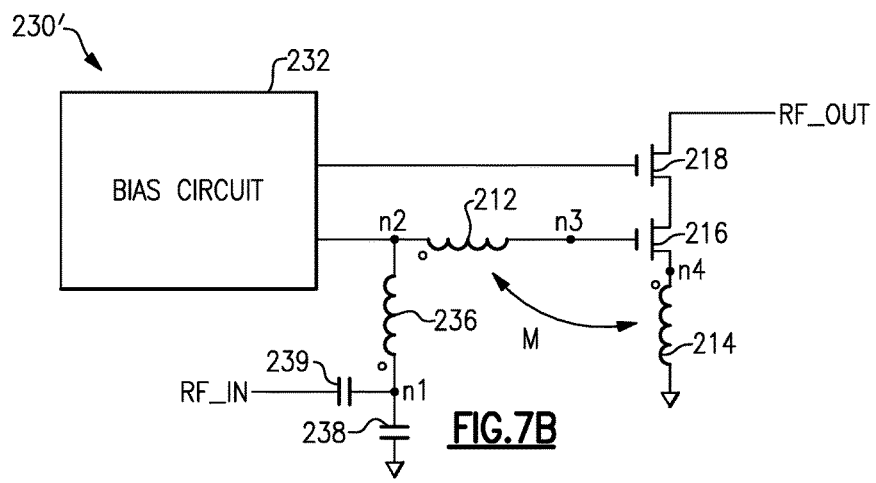
FIG. 7B is a schematic diagram that illustrates a low noise amplifier according to another embodiment.
Figure 7C:
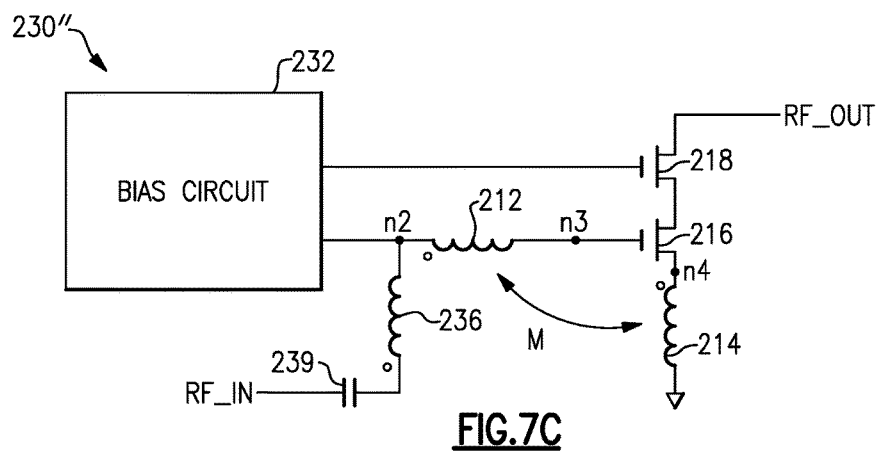
FIG. 7C is a schematic diagram that illustrates a low noise amplifier according to another embodiment.

FIGS. 7A, 7B, and 7C are schematic diagrams of illustrate low noise amplifier systems that include low noise amplifiers according to certain embodiments. These LNAs include different input matching circuits. Any of the principles and advantages of these matching circuits can be implemented in connection with any of the low noise amplifiers discussed herein as appropriate.

FIG. 7A is a schematic diagram of a low noise amplifier system 230 that includes an LNA and a bias circuit 232. The LNA illustrated in FIG. 7A includes a matching circuit, an amplification circuit, and a degeneration inductor. The amplification circuit of this LNA corresponds to the amplification circuit of the LNA 210 of FIG. 6A. It will be understood that any of the principles and advantages discussed with reference to FIGS. 7A to 7C can be implemented in connection with other suitable amplification circuits, such as the amplification circuit of the LNA 210' of FIG. 6B and/or the amplification circuit 226 of the LNA 210″ of FIG. 6C. In FIG. 7B, the inductors 212 and 214 are magnetically coupled to each other and can function as discussed above.

The matching circuit illustrated in FIG. 7A includes the first inductor 212, a series inductor 236, and a shunt capacitor 238. The matching circuit can provide input impedance matching for the LNA. The RF input signal RF_IN can be provided at node n1. The shunt capacitor 238 is electrically connected to the series inductor 236 at node n1. The shunt capacitor 238 can provide impedance matching at node n1. For instance, the impedance of the shunt capacitor 238 can terminate at a phase corresponding to a fundamental frequency of the RF input signal RF_IN. The RF input signal RF_IN can be provided to the amplification circuit of the LNA by way of the series inductor 236 and the first inductor 212. Magnetic coupling between the first inductor 212 and the second inductor 214 can increase the impedance at node n2. Accordingly, the impedance at node n1 can be increased by this magnetic coupling. Thus, with the increase in impedance from this magnetic coupling, the inductance of the first inductor 212 and/or the inductance of the series inductor 236 can be decreased and provide similar input matching. This can advantageously decrease the physical area of the first inductor 212 and/or the series inductor 236, which can be significant. Inductors with relatively lower inductance can also improve noise performance of the LNA.

The bias circuit 232 can provide a first bias for the common source amplifier 216 at node n2. The first bias can be provided to the gate of the common source amplifier 216 by way of the first inductor 212. In some instances, the bias circuit 232 can provide a second bias to the gate of the common gate amplifier 218. The bias circuit 232 can be implemented by any suitable bias circuit.

The low noise amplifier system 230′ of FIG. 7B is similar to the low noise amplifier system 230 of FIG. 7A, except that the matching circuit of the LNA in FIG. 7B also includes a DC blocking capacitor 239. As illustrated, the DC blocking capacitor 239 is coupled between a received RF signal and node n1. The DC blocking capacitor 239 can block DC signal components of the RF input signal RF_IN from being provided to node n1.

The low noise amplifier system 230″ of FIG. 7C is similar to the low noise amplifier system 230′ of FIG. 7B, except that the matching circuit of the LNA in FIG. 7C does not include the shunt capacitor 238.

Figure 7D:
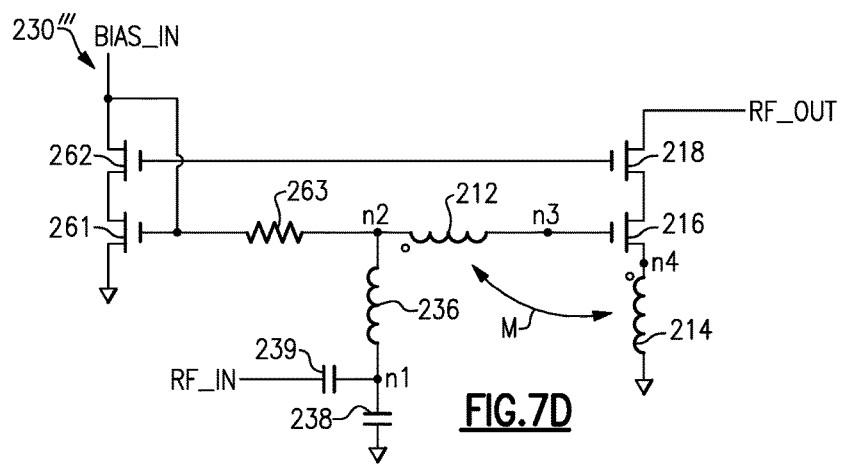
FIG. 7D is a schematic diagram of a low noise amplifier system that includes an illustrative bias circuit according to an embodiment.

FIG. 7D is schematic diagram of a low noise amplifier system 230‴ that includes an example bias circuit according to an embodiment. The bias circuit of FIG. 7D is an example of the bias circuit 232 of FIGS. 7A to 7C. The bias circuit can include a current mirror to provide a bias signal to an amplification circuit of an LNA. As illustrated in FIG. 7D, the bias circuit includes transistors 261 and 262, and a biasing element 263, such as a resistor. The bias circuit is configured to provide a bias voltage to the transistor 216 by way of the biasing element 263. The biasing input BIAS_IN can be a current provided by a current source.

Figure 7E:
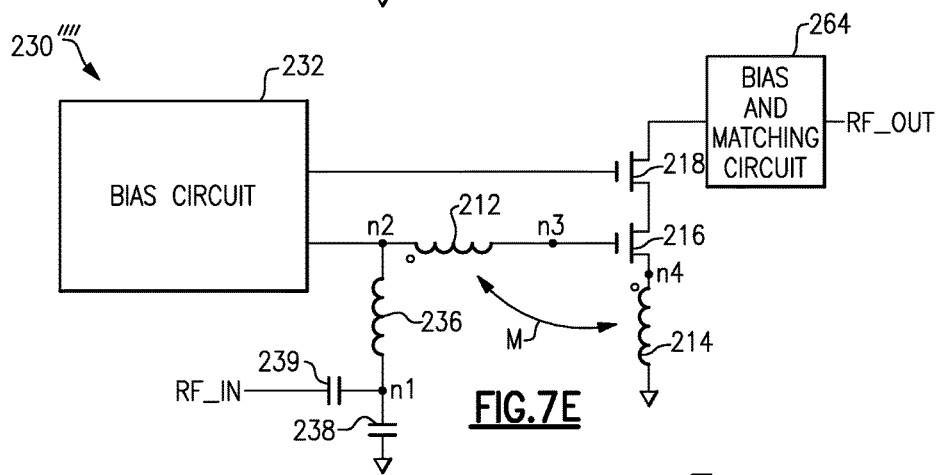
FIG. 7E is a schematic diagram of a low noise amplifier system with a bias and matching circuit according to an embodiment.

FIG. 7E is schematic diagram of low noise amplifier system 230⁗ that includes a bias and matching circuit 264 coupled to an output of a low noise amplifier according to an embodiment. The bias and matching circuit 264 can include any suitable circuit elements to bias the output of the LNA and/or to provide impedance matching at the output of the LNA. The bias and matching circuit 264 can be implemented in connection with any of the LNAs discussed herein.

Figure 7F:
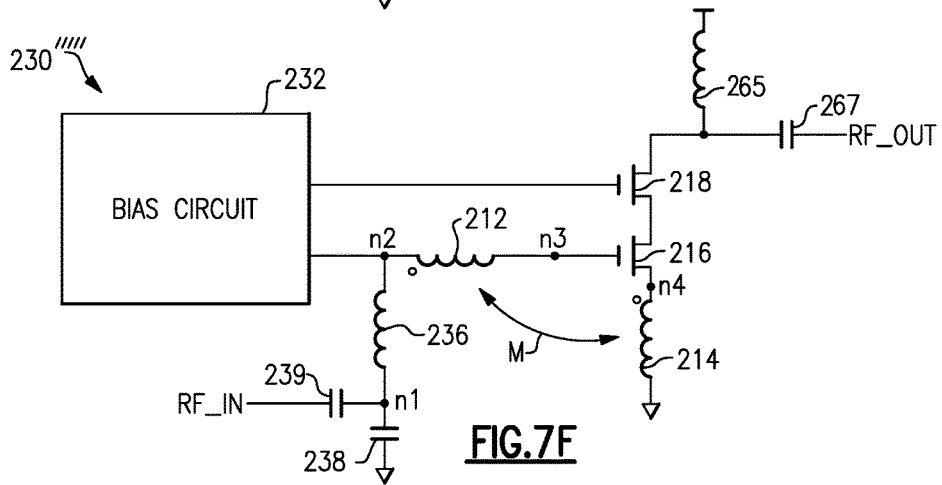
FIG. 7F is a schematic diagram of a low noise amplifier system that includes an illustrative bias and matching circuit according to an embodiment.

FIG. 7F is schematic diagram of low noise amplifier system 230⁗′ that includes an example bias and matching circuit coupled to an output of a low noise amplifier according to an embodiment. The bias and matching circuit of FIG. 7F is an example of the bias and matching circuit 264 of FIG. 7E. The bias and matching circuit of 7F includes an inductor 265 and a capacitor 267. The inductor 265 can provide a bias to the output of the LNA. The capacitor 267 can provide impedance matching. Other suitable passive impedance networks can alternatively be implemented to provide biasing and impedance matching at the output of the LNA.

Figure 8:
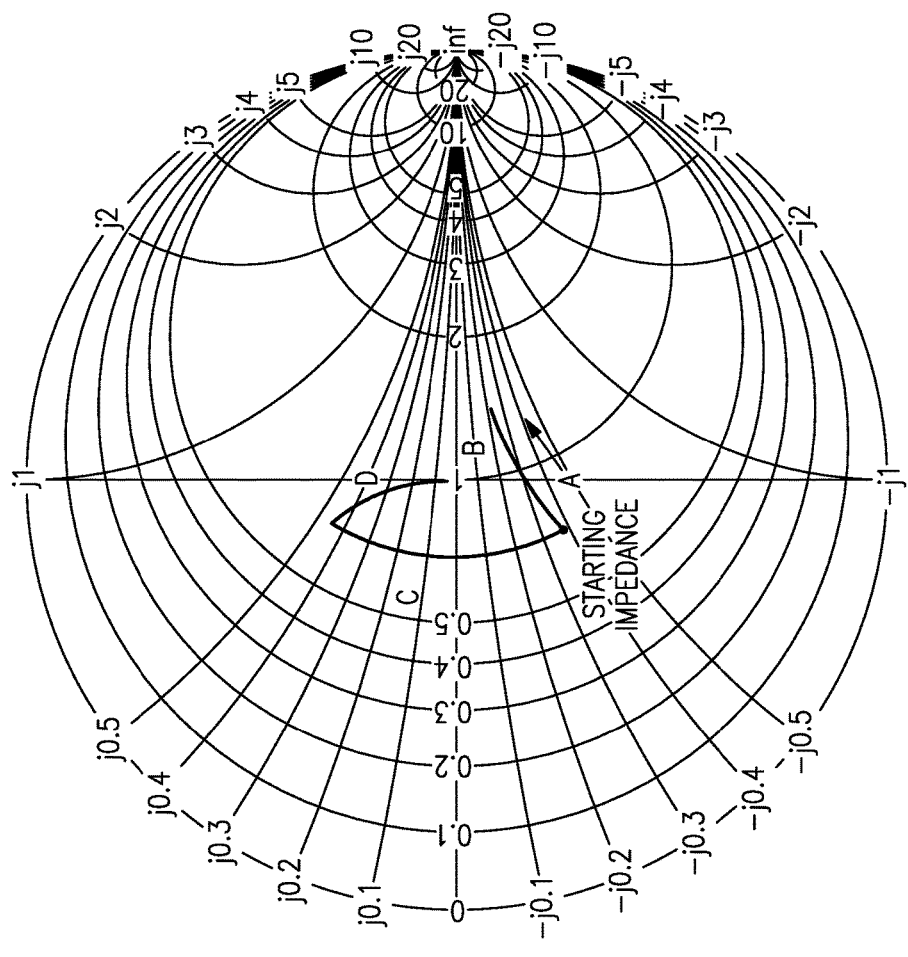
FIG. 8 is a Smith chart corresponding to the passive impedance network of FIG. 7A.

FIG. 8 is a Smith chart corresponding to the matching circuit and the degeneration inductor of the noise amplifier system of FIG. 7A. This Smith chart shows how the input impedance from the starting impedance varies when the magnetically coupled inductors 212 and 214 are implemented. The arrow on this chart shows the direction for increasing magnetic coupling. Locus A shows how the impedance at node n2 of FIG. 7A varies as the coupling factor is changed between the first inductor 212 and the second inductor 214. Locus A is relatively close to the effect of adding a series resistance. Locus B is the addition of the series inductor 236, from the point where locus A crosses the 50 Ohm resistance line. The net effect is that the series inductor 236 can also be significantly smaller (e.g., in the example shown B=1 nH and C=2.7 nH at 2.5 GHz). Locus C shows the effect of the series inductor 236. Locus D shows the effect of the shunt capacitor 238.

Low Noise Amplifiers with Overload Protection and Impedance Transformation

Figure 9A:
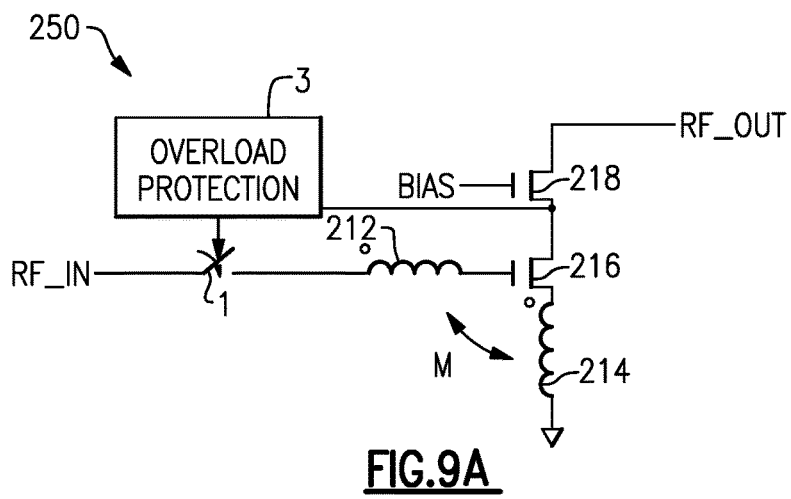
FIG. 9A is a schematic diagram of an LNA system according to an embodiment.
Figure 9B:
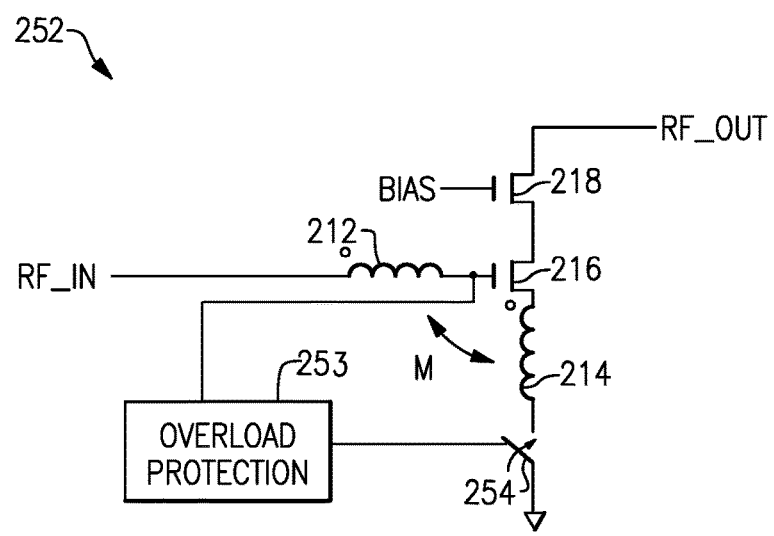
FIG. 9B is a schematic diagram of an LNA system according to another embodiment.
Figure 10:
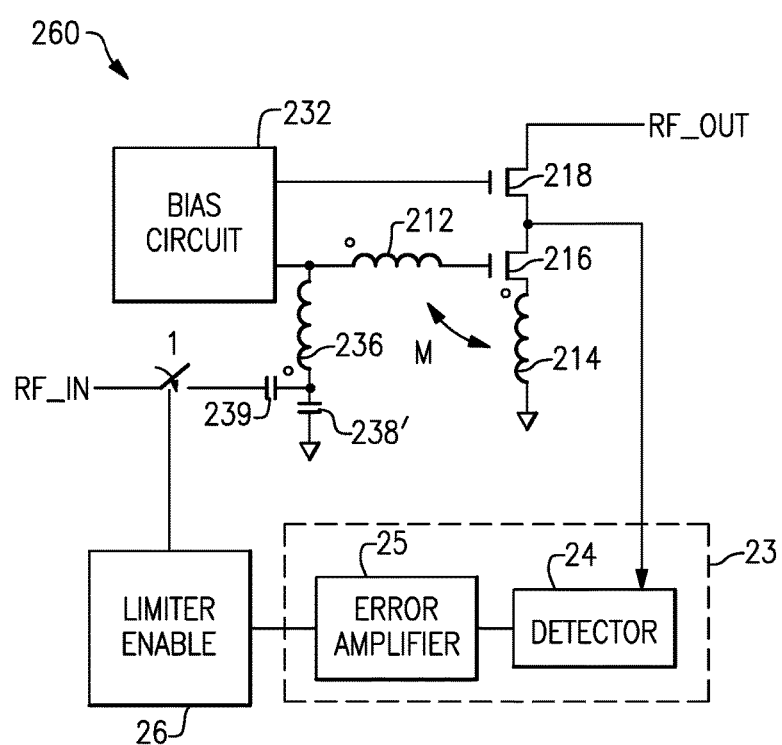
FIG. 10 is a schematic diagram of an LNA system according to an embodiment.

A low noise amplifier system can include overload protection and an impedance transformation circuit to provide negative feedback to linearize a low noise amplifier. Such a low noise amplifier system can be implemented in accordance with any of the principles and advantages discussed herein, such as any of the principles and advantages related to overload protection and/or to linearizing a low noise amplifier. In certain embodiments, combining features related to overload protection and linearizing a low noise amplifier can synergistically create an improved low noise amplifier system. For instance, degradation in linearity resulting from signal level detection for overload protection at an output of the low noise amplifier can be reduced and/or eliminated using an impedance transformation circuit in accordance with the principles and advantages discussed herein. FIGS. 9A, 9B, and 10 illustrate example low noise amplifier systems that can implement overload protection and impedance transformation. Other low noise amplifier systems can implement any suitable combination of features discussed herein.

Low noise amplifier systems implemented in accordance with the principles and advantages discussed herein can provide overload protection. For instance, an example method of overload protection includes: providing a radio frequency signal to a low noise amplifier by way of an input switch, in which low noise amplifier includes first and second inductors magnetically coupled to each other to provide negative feedback to linearize the low noise amplifier; amplifying the radio frequency signal using the low noise amplifier; detecting a signal level associated with the low noise amplifier; and increasing an impedance of the input switch responsive to said detecting indicating an overload condition to thereby provide overload protection.

Overload protection can be implemented by an overload protection circuit and a switch coupled to an amplification circuit of a low noise amplifier. The overload protection circuit can detect a signal level associated with a radio frequency signal that is provided to the amplification circuit for amplification. The switch can be an input switch configured to provide the radio frequency signal to the low noise amplifier for amplification. An impedance of the input switch can be adjusted in response to the overload protection circuit detecting an overload condition. An example embodiment with an input switch is provided in FIG. 9A. Alternatively, the switch can be in series with a degeneration inductor of the low noise amplifier. An impedance of the switch that is in series with the degeneration inductor can be adjusted in response to the overload protection circuit detecting an overload condition. An example embodiment with a switch in series a degeneration inductor with is provided in FIG. 9B.

FIG. 9A is a schematic diagram of a low noise amplifier system 250 according to an embodiment. As illustrated, the low noise amplifier system 250 includes an input switch 1, an overload protection circuit 3, and a low noise amplifier. The low noise amplifier illustrated in FIG. 9A includes a first inductor 212, a second inductor 214, a first transistor 216, and a second transistor 218. The input switch 1 can selectively provide an RF input signal RF_IN to the low noise amplifier.

In FIG. 9A, the first inductor 212 is coupled in series between the input switch 1 and the first transistor 216. In some other instances (not illustrated), the input switch 1 can be coupled in series between the first inductor 212 and the first transistor 216. As illustrated, the first inductor 212 is magnetically coupled to the second inductor 214 to provide negative feedback to linearize the low noise amplifier. The second inductor 214 is configured as a degeneration inductor in FIG. 9A. The second transistor 218 is coupled between an output of the low noise amplifier and the first transistor 216. An RF output signal RF_OUT of the low noise amplifier is provided by the second transistor 218.

In FIG. 9A, the overload protection circuit 3 is coupled to the low noise amplifier. The overload protection circuit 3 can detect a signal level of the low noise amplifier and provide a feedback signal to the input switch 1. While the overload protection circuit 3 is illustrated a being coupled to a node between the first transistor 216 and the second transistor 218 in FIG. 9A, the overload protection circuit 3 can be coupled to any suitable node of the low noise amplifier in some other embodiments. The input switch 1 can provide the feedback signal to a control input of the input switch to cause an impedance of the input switch to be adjusted. Accordingly, the input switch 1 can attenuate the RF input signal RF_IN in response to the overload protection circuit 3 detecting an overload condition. The feedback signal can be an analog signal. The feedback signal can be superimposed on a control signal provided to the input switch 1.

FIG. 9B is a schematic diagram of a low noise amplifier system 252 according to an embodiment. The low noise amplifier system 252 is like the low noise amplifier system 250 of FIG. 9A except that a different overload protection circuit 253 is implemented and a switch 254 is included in series with the second inductor 214. Like the input switch 1 of FIG. 9A, the switch 254 is coupled to an amplification circuit of a low noise amplifier. As illustrated, the switch 254 is coupled to the first transistor 216 by way of the second inductor 214. In some other embodiments (not illustrated), the switch 254 can be coupled between the second inductor 214 and the first transistor 216. In the low noise amplifier system 252, the first transistor 216 is included in the amplification circuit of an LNA and the second inductor 214 serves as a degeneration inductor. The overload protection circuit 253 can control an amount of degeneration provided by the switch 254 and the second inductor 214 so as to provide overload protection for the low noise amplifier. This can limit relatively large current and/or voltage swing conditions manifesting within circuitry of the LNA.

As illustrated, the overload protection circuit 253 is configured to receive the RF input signal RF_IN. The overload protection circuit 253 can generate a detection signal indicating a detected signal level of the RF input signal RF_IN. The overload protection circuit 253 can provide the detection signal to the switch 254 to control an amount of degeneration provided by the switch 254 and the second inductor 214 to provide overload protection for the LNA. For instance, in response to detecting an overload condition, the overload protection circuit 253 can increase the impedance of the switch 254. By increasing the amount of degradation impedance, the bias of the amplification circuit of the LNA can be cut off and/or a gain of the amplification circuit can be reduced.

During operation of the low noise amplifier, a voltage gain can be provided across an input matching circuit. The input matching circuit can include the first inductor 212. In some instances, the input matching circuit can include a series inductor and/or any other passive impedance elements of the matching circuits of any of FIGS. 7A to 7C. The voltage gain provided by the input matching circuit can aid the overload protection circuit 253 in generating a detection signal indicative of an overload condition. Accordingly, including an input matching circuit can enhance the performance of the overload protection circuit 253. While the overload protection circuit 253 is illustrated as receiving an RF signal for detecting a signal level at a node between the first inductor 212 and the first transistor 216, the overload protection circuit 253 can receive an RF signal for detecting a signal level from a different node in a matching circuit in some other embodiments.

In certain embodiments, the overload protection circuit 253 can generate a detection signal to control the switch 254 based on an internal signal level of an electrostatic discharge (ESD) protection circuit. The ESD protection circuit can protect the LNA from ESD events. The ESD protection circuit can include a plurality of diodes in series, and a detection circuit of the overload protection circuit 253 can generate the detection signal based on a voltage across one or more of the plurality of diodes. A buffer can control the switch 254 based on the detection signal. Such a buffer can be powered at least in part by the detection signal. The buffer can also base enabled based on a digital signal. A resistor can be coupled between the buffer and a control terminal of the switch 254.

FIG. 10 is a schematic diagram of a low noise amplifier system 260 according to an embodiment. The low noise amplifier system 260 is like the low noise amplifier system 250 of FIG. 9A and includes additional features and/or additional detail. Any subset of the additional features and/or details shown in FIG. 10 can be implemented in connection with the low noise amplifier system 250 of FIG. 9A and/or the low noise amplifier system 252 of FIG. 9B.

As shown in FIG. 10, a bias circuit 232 can be included in a low noise amplifier system. As illustrated, a series inductor 236 can be coupled in series between the input switch 1 and the first inductor 212. A direct current blocking capacitor 239 can be coupled in series between the series inductor 326 and the input switch 1. A shunt capacitor 238 can be coupled to a node between the input switch and the series inductor 236. Although FIG. 10 illustrates the direct current blocking capacitor 239, the series inductor 236 and the first inductor 212 coupled between the input switch 1 and the first transistor 216, the input switch 1 can be coupled between one or more of these elements and the first transistor 216 in some other instances.

The illustrated low noise amplifier system 260 includes an overload protection circuit 23 and a limiter enable circuit 26. The overload protection circuit 23 includes a detector 24 and an error amplifier 25. The overload protection circuit 23 can implement any suitable combination of features of the overload protection circuits discussed herein. The limiter enable circuit 26 can implement any suitable combination of features of the limiter enable circuits discussed herein.

Front End Systems

A front end system can include circuits in signal paths between one or more antennas and a baseband system. Some front end systems include circuits in a signal path between one or more antennas and a mixer configured to modulate a signal to RF or to demodulate an RF signal. Front end systems can process RF signals. Accordingly, front end systems can be referred to as RF front end systems.

FIGS. 11A, 11B, 11C, and 11D are schematic block diagrams of illustrative front end systems according to certain embodiments. The front end systems illustrated in 11A, 11B, 11C, and 11D can be in implemented in a packaged module. The packaged module can be referred to as a front end module. Such packaged modules can include a relatively low cost laminate substrate based front end module that combines switch functions with LNAs and/or power amplifiers in certain instances. Some such packaged modules can be multi-chip modules. In certain implementations, one or more of the illustrated circuit components in any of the front end systems in 11A, 11B, 11C, and 11D can be embodied on a single die. Such a die can be manufactured using any suitable process technology. As one example, the die can be a semiconductor-on-insulator die, such as a silicon-on-insulator die. According to some implementations, one or more antennas can be integrated with any of the front end systems and/or front end modules discussed herein.

Figure 11A:
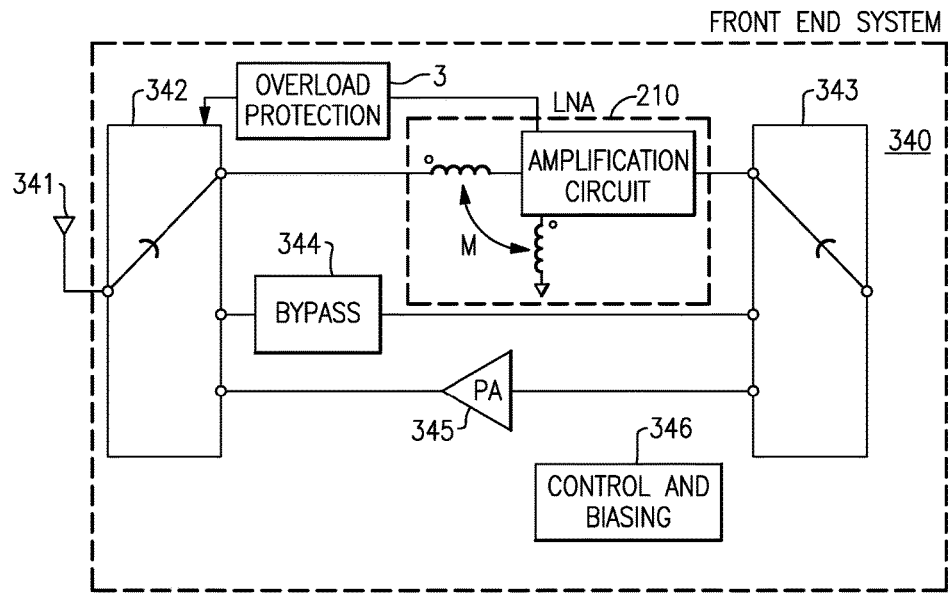
FIG. 11A is a schematic block diagram of a front end system includes a low noise amplifier, a bypass path, a power amplifier, and multi-throw switches according to an embodiment.

FIG. 11A is a schematic block diagram of an RF front end system 340 according to an embodiment. The RF front end system 340 is configured to receive RF signals from an antenna 341 and to transmit RF signals by way of the antenna 341. The illustrated front end system 340 includes a first multi-throw switch 342, a second multi-throw switch 343, a receive signal path that includes an LNA 210, an overload protection circuit 3, a bypass signal path that includes a bypass network 344, and a transmit signal path that includes a power amplifier 345. The overload protection circuit 3 can be implemented in accordance with any of the principles and advantages discussed herein. The LNA 210 includes an impedance transformation circuit that includes magnetically coupled inductors to provide negative feedback to linearize the LNA 210. The LNA 210 can include any of the principles and advantages of any of the LNAs discussed herein. The bypass network 344 can include any suitable network for matching and/or bypassing the receive signal path and the transmit signal path. The bypass network 344 can be implemented by a passive impedance network or by a conductive trace or wire. The power amplifier 345 can be implemented by any suitable power amplifier configured to amplify am RF signal for transmission via the antenna 341.

The first multi-throw switch 342 can selectively electrically connect a particular signal path to the antenna 341. The first multi-throw switch 342 can electrically connect the receive signal path to the antenna 341 in a first state, electrically connect the bypass signal path to the antenna 341 in a second state, and electrically connect the transmit signal to the antenna 341 in a third state. As shown in FIG. 11A, the first multi-throw switch 342 can receive an output or feedback signal from the overload protection circuit 3. While not illustrated in FIG. 11A, the first multi-throw switch 342 can receive the feedback signal from the overload protection circuit 3 by way of a limiter enable circuit. In the first state, the feedback signal can control an impedance of the first multi-throw switch 342 between the antenna 341 and the input to the LNA 210. For instance, a gate of a field effect transistor of the switch 342 coupled in series between the antenna 341 and the LNA 210 can receive the feedback signal.

The second multi-throw switch 343 can selectively electrically connect a particular signal path to an input/output port of the front end system 340, in which the particular signal path is the same signal path electrically connected to the antenna 341 by way of the first multi-throw switch 342. Accordingly, second multi-throw switch 343 together with the first multi-throw switch 342 can provide signal path between the antenna 341 and the input/output port of the front end system 340.

The control and biasing circuit 346 can provide any suitable biasing and control signals to the front end system 340. For example, the control and biasing block 46 can provide bias signals to the LNA 210 and/or the power amplifier 345. Alternatively or additionally, the control and biasing block 346 can also provide control signals to the multi-throw switches 342 and 343. In certain embodiments, the control and biasing circuit 346 can provide any suitable control and/or biasing signals to the overload protection circuit 3.

Figure 11B:
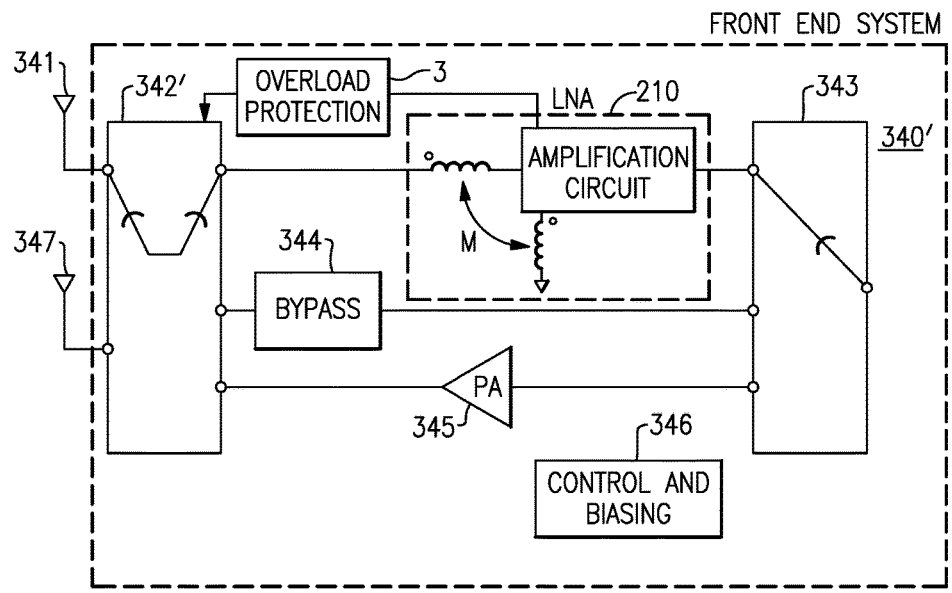
FIG. 11B is a schematic block diagram of a front end system that includes a plurality of antenna ports according to another embodiment.

FIG. 11B is a schematic block diagram of an RF front end system 340' according to an embodiment. The RF front end system 340' of FIG. 11B is similar to the RF front end system 340 of FIG. 11A, except the multi-throw switch 342' is configured to selectively electrically connect a particular signal path to either a first antenna 341 or a second antenna 347. The multi-throw switch 342' can be a multi-throw, multi-pole switch.

Figure 11C:
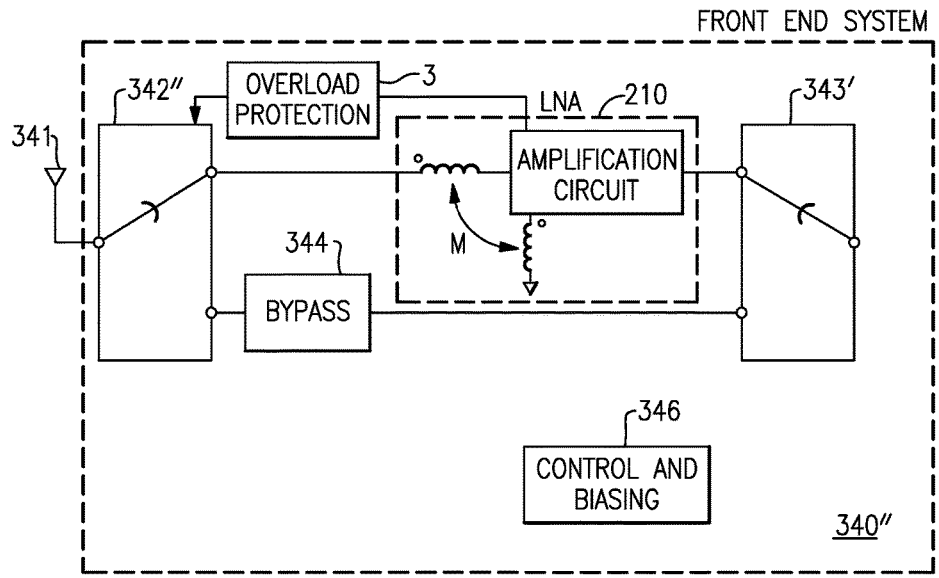
FIG. 11C is a schematic block diagram of a front end system that includes a bypass path and low noise amplifier according to another embodiment.

FIG. 11C is a schematic block diagram of an RF front end system 340" according to an embodiment. The RF front end system 340" of FIG. 11C is similar to the RF front end system 340 of FIG. 11A, except that a transmit signal path is omitted and the multi-throw switches 342" and 343' each have one fewer throw. The illustrated front end system 340" includes a receive signal path and a bypass signal path and does not include a transmit signal path.

Figure 11D:
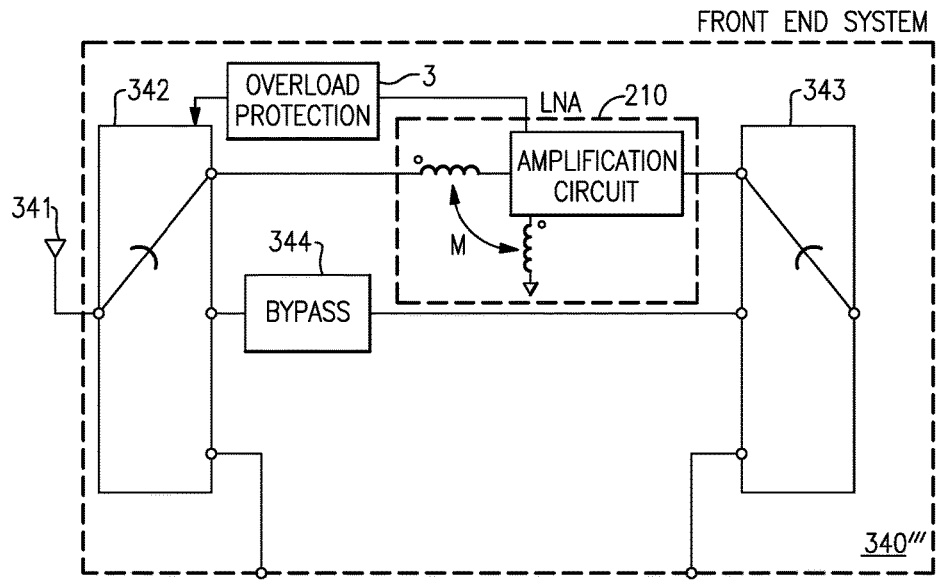
FIG. 11D is a schematic block diagram of a front end system that includes a bypass path, ports connectable to a radio frequency signal path such as a transmit path, and low noise amplifier according to another embodiment.

FIG. 11D is a schematic block diagram of an RF front end system 340''' according to an embodiment. The RF front end system 340''' of FIG. 11D is like the RF front end system 340 of FIG. 11A, except that a power amplifier of the transmit signal path is omitted from the RF front end system 340'''. The RF front end system 340''' includes input/output ports for coupling to throws of the multi-throw switches 342 and 343. A power amplifier external to the front end system 340''' can be electrically connected between these input/output ports such that the power amplifier is included in the transmit signal path between the multi-throw switches 342 and 343. The power amplifier can be included in a different packaged module and/or embodied on a different die that the any or all of the illustrated elements of the RF front end system 340'''.

While FIGS. 11A to 11D illustrate a first multi-throw switch coupled between an antenna and an input of the LNA 210, a switch is not coupled between the antenna and the input of the LNA 210 in some other front end system embodiments. Such embodiments can include a switch in series with a degeneration inductor (e.g., the switch 254 of FIG. 9B) that can provide overdrive protection for the LNA.

Packaged Modules

Figure 11E:
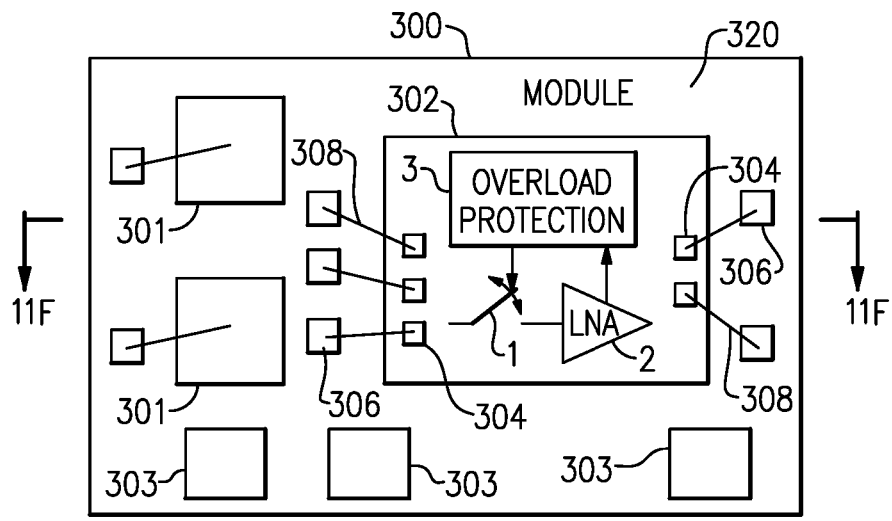
FIG. 11E is a schematic diagram of an embodiment of a packaged module.
Figure 11F:
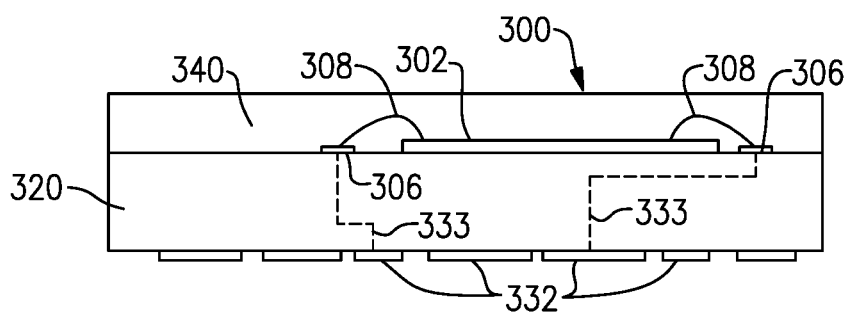
FIG. 11F is a schematic diagram of a cross-section of the packaged module of FIG. 11E taken along the lines 11F-11F.

The low noise amplifier systems discussed herein can be implemented in packaged modules. FIG. 11E is a schematic diagram of an embodiment of a packaged module 300. FIG. 11F is a schematic diagram of a cross-section of the packaged module 300 of FIG. 11E taken along the lines 11F-11F.

The packaged module 300 includes a semiconductor die 302, surface mount components 303, wirebonds 308, a package substrate 320, and encapsulation structure 340. The package substrate 320 includes pads 306 formed from conductors disposed therein. Additionally, the semiconductor die 302 includes pins or pads 304, and the wirebonds 308 have been used to connect the pads 304 of the die 302 to the pads 306 of the package substrate 302.

The semiconductor die 302 includes an input switch 1, an LNA 2, and an overload protection circuit 3, which can be implemented in accordance with any suitable principles and advantages discussed herein. For instance, the LNA 2 can include magnetically coupled inductors and a matching circuit. As another example, the overload protection circuit 3 and the input switch 1 can implemented overload protection for the LNA 2. In certain implementations, the semiconductor die 302 further includes a limiter enable circuit and/or a power amplifier formed thereon. According to some embodiments (not illustrated), the switch 254 of FIG. 9B can be included on the semiconductor die 302 in place of the input switch 1.

The packaging substrate 320 can be configured to receive a plurality of components such as the semiconductor die 302 and the surface mount components 303, which can include, for example, surface mount capacitors and/or inductors.

As shown in FIG. 11F, the packaged module 300 is shown to include a plurality of contact pads 332 disposed on the side of the packaged module 300 opposite the side used to mount the semiconductor die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor die 302 and/or the surface mount components 303. As shown in FIG. 7B, the electrical connections between the contact pads 332 and the semiconductor die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Semiconductor Die

Figure 12:
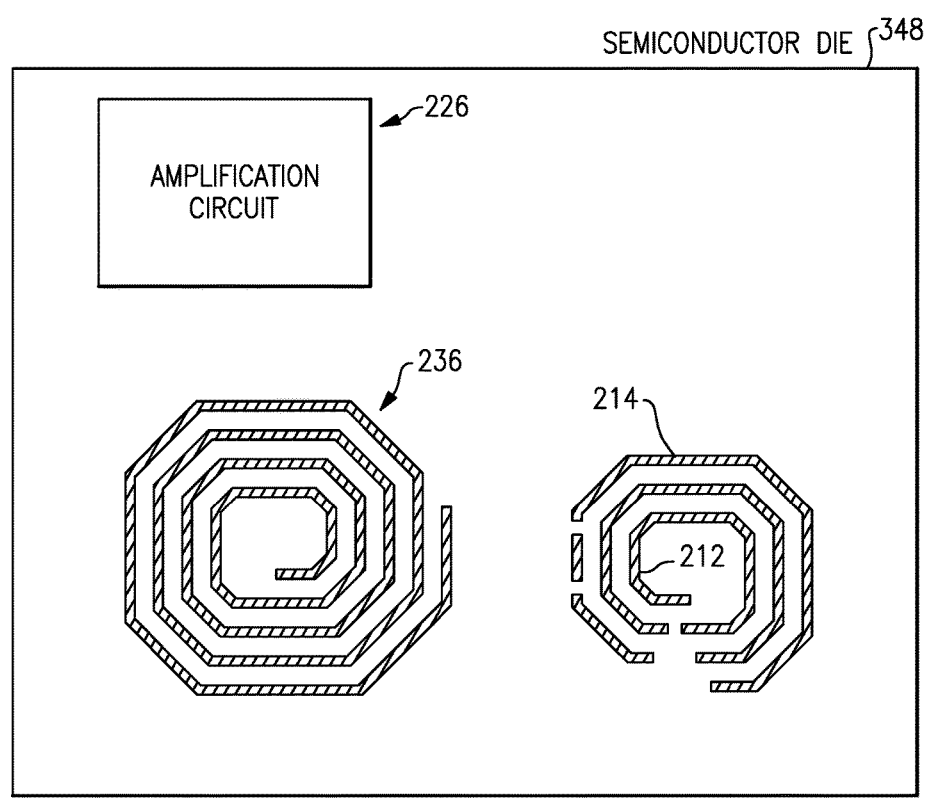
FIG. 12 illustrates a physical layout of magnetically coupled inductors of a low noise amplifier according to an embodiment.

Some or all of the circuit elements of the LNAs and/or front end systems discussed above can be implemented on a single semiconductor die. FIG. 12 illustrates a physical layout of magnetically coupled inductors of a low noise amplifier according to an embodiment. As illustrated, a die 348 includes an amplification circuit 226, a first inductor 212, and a second inductor 214 that is magnetically coupled with the first inductor 212. The die 348 can also include a series inductor 236, as illustrated. The die 348 can be manufactured using any suitable process technology. As one example, the die 348 can be a semiconductor-on-insulator die, such as a silicon-on-insulator die.

The first inductor 212 and the second inductor 214 can each include one or more annular turns. The first inductor 212 and the second inductor 214 can be interleaved with each other. In some instances, the first inductor 212 and/or the second inductor 214 can be implemented in two metal layers with conductive connections between metals in the two metal layers. This can lower resistance of the metal and increase the quality factor of an inductor.

The first inductor 212 and the second inductor 214 can be wound around a magnetic core in some instances. Alternatively, a magnetic core can be implemented around the first inductor 212 and the second inductor 214 in certain applications.

While FIG. 12 is not necessarily to scale, this drawing illustrates that the first inductor 212 and the second inductor 214 can be relatively large and can consume significant physical die area. As also illustrated, the series inductor 236 can be relatively large and can consume significant physical die area. Accordingly, reducing the inductance and thus the size of the first inductor 212 (and/or the series inductor 236 described above) can result in a significant reduction in physical area consumed by an LNA.

Wireless Communication Devices

Figure 13A:
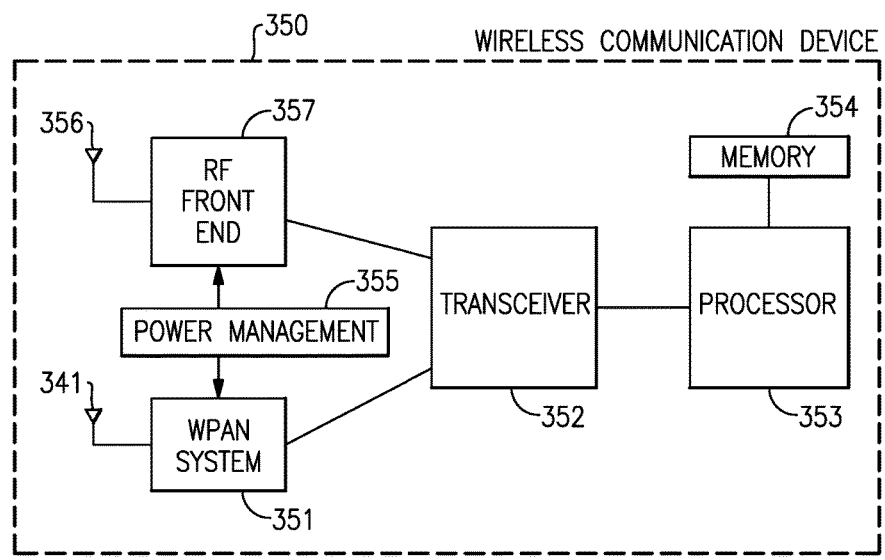
FIG. 13A is a schematic diagram of a wireless communication device according to an embodiment.
Figure 13B:
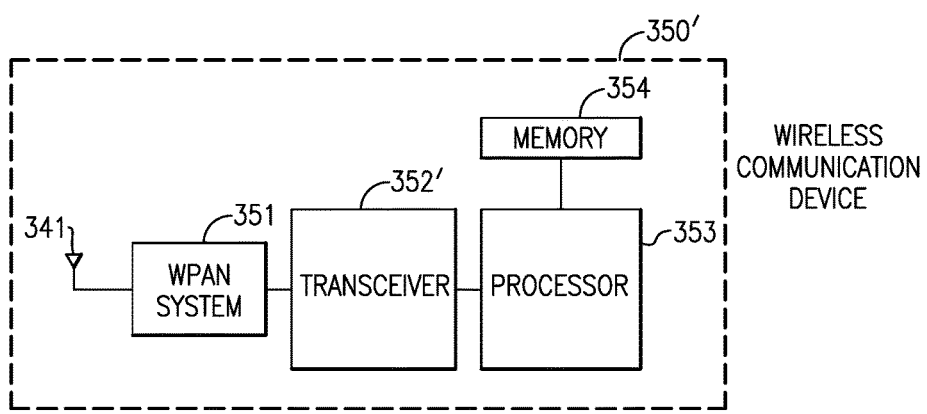
FIG. 13B is a schematic diagram of a wireless communication device according to an embodiment.

FIGS. 13A and 13B are schematic block diagrams of illustrative wireless communication devices that include an LNA system and/or a front end system in accordance with one or more embodiments. The wireless communication devices can be any suitable wireless communication device. For instance, a wireless communication device can be a mobile phone, such as a smart phone.

FIG. 13A is a schematic diagram of a wireless communication device 350 according to an embodiment. As illustrated, the wireless communication device 350 includes a first antenna 341, a wireless personal area network (WPAN) system 351, a transceiver 352, a processor 353, a memory 354, a power management block 355, a second antenna 356, and an RF front end system 357. Any of the overload protection schemes and/or LNAs discussed herein can be implemented in the WPAN system 351 and/or the RF front end system 357. The WPAN system 351 is an RF front end system configured for processing RF signals associated with personal area networks (PANs). The WPAN system 351 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless local area network (WLAN) system can be implemented in place of the illustrated WPAN system 351, and the WLAN system can process wireless local area signals, such as Wi-Fi signals.

FIG. 13B is a schematic diagram of a wireless communication device 350' according to another embodiment. The illustrated wireless communication device 350' of FIG. 13B is a device configured to communicate over a PAN. This wireless communication device can be relatively less complex than the wireless communication device 350 of FIG. 13A. As illustrated, the wireless communication device 350' includes an antenna 341, a WPAN system 351, a transceiver 362, a processor 353, and a memory 354. The WPAN system 351 can include a low noise amplifier with an overload protection circuit in accordance with any of the principles and advantages discussed herein. In another embodiment, a wireless local area network (WLAN) system can be implemented in place of the illustrated WPAN system 351, and the WLAN system can process WLAN signals such as Wi-Fi signals.

Applications

Any of the principles and advantages discussed herein can be applied to other systems, not just to the systems described above. The elements and operations of the various embodiments described above can be combined to provide further embodiments. Some of the embodiments described above have provided examples in connection with low noise amplifiers, front end modules and/or wireless communications devices. However, the principles and advantages of the embodiments can be used in connection with any other systems, apparatus, or methods that benefit could from any of the teachings herein. For instance, any of the principles and advantages discussed herein can be implemented in connection with an amplifier with a need for overload protection and/or linearization. Any of the principles and advantages discussed herein can be implemented in RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, wireless communication devices, personal area network communication devices, uplink cellular devices, wireless cellular communications infrastructure such as a base station, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Conclusion

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A low noise amplifier system comprising:
   a low noise amplifier including a first inductor, an amplification circuit configured to receive a radio frequency signal by way of a matching circuit that includes the first inductor and to amplify the radio frequency signal, and a second inductor magnetically coupled to the first inductor to provide negative feedback to linearize the low noise amplifier;
   a switch coupled to the amplification circuit of the low noise amplifier; and
   an overload protection circuit configured to adjust an impedance of the switch based on a signal level associated with the radio frequency signal to provide overload protection for the low noise amplifier.

2. A low noise amplifier system comprising:
   a low noise amplifier including a first inductor, an amplification circuit configured to amplify a radio frequency signal, and a second inductor magnetically coupled to the first inductor to provide negative feedback to linearize the low noise amplifier;
   a switch coupled to the amplification circuit of the low noise amplifier, the switch being an input switch configured to provide the radio frequency signal to the amplification circuit for amplification; and
   an overload protection circuit configured to adjust an impedance of the switch based on a signal level associated with the radio frequency signal to provide overload protection for the low noise amplifier.

3. The low noise amplifier system of claim 2 wherein the overload protection circuit is configured to provide a feedback signal to an analog control input of the input switch to adjust the impedance of the input switch.

4. The low noise amplifier system of claim 2 further comprising a limiter enable circuit coupled between an output of the overload protection circuit and a control input of the input switch, the overload protection circuit being configured to provide a feedback signal to the control input by way of the limiter enable circuit.

5. The low noise amplifier system of claim 2 wherein the overload protection circuit includes a detector and an error amplifier, the detector is configured to generate a detection signal based on detecting the signal level, and the error amplifier is configured to generate a feedback signal for the input switch based on the detection signal.

6. A low noise amplifier system comprising:
a low noise amplifier including a first inductor, an amplification circuit configured to amplify a radio frequency signal, and a second inductor magnetically coupled to the first inductor to provide negative feedback to linearize the low noise amplifier;
a switch coupled to the amplification circuit of the low noise amplifier; and
an overload protection circuit configured to adjust an impedance of the switch based on a signal level associated with the radio frequency signal to provide overload protection for the low noise amplifier, and the overload protection circuit being configured to increase the impedance of the switch responsive to detecting that the signal level indicates an overload condition.

7. The low noise amplifier system of claim 6 wherein the amplification circuit is configured to receive the radio frequency signal by way of a matching circuit that includes the first inductor.

8. The low noise amplifier system of claim 1 wherein the first inductor and the second inductor together function as a transformer having a primary winding in series with an input of the amplification circuit and a secondary winding connected between a transistor of the amplification circuit and a low voltage reference.

9. The low noise amplifier system of claim 1 wherein the second inductor is configured as a degeneration inductor.

10. The low noise amplifier system of claim 9 wherein the switch is in series with the second inductor.

11. The low noise amplifier system of claim 1 further comprising a series inductor arranged in series with the first inductor.

12. The low noise amplifier system of claim 11 further comprising a direct current blocking capacitor, the series inductor electrically connected between the direct current blocking capacitor and the first inductor.

13. A front end system comprising:
a low noise amplifier including a first inductor, an amplification circuit configured to receive a radio frequency signal by way of the first inductor and to amplify the radio frequency signal, and a second inductor magnetically coupled to the first inductor to provide negative feedback to linearize the low noise amplifier;
an input switch having a control input arranged to control an impedance of the input switch, the input switch including a first throw coupled to the first inductor; and
an overload protection circuit configured to provide a feedback signal to the control input of the input switch based on based on a signal level associated with the low noise amplifier.

14. The front end system of claim 13 further comprising a limiter enable circuit coupled between an output of the overload protection circuit and the control input of the input switch, the overload protection circuit being configured to provide the feedback signal to the control input by way of the limiter enable circuit.

15. The front end system of claim 13 further comprising a series inductor arranged in series between the input switch and the first inductor.

16. The front end system of claim 13 further comprising a bypass path, the input switch further including a second throw electrically connected to the bypass path.

17. The front end system of claim 16 further comprising a power amplifier, the input switch further including a third throw electrically connected to the power amplifier.

18. The front end system of claim 13 further comprising a package enclosing the low noise amplifier, the input switch, and the overload protection circuit.

19. A method of providing overload protection in a low noise amplifier system, the method comprising:
amplifying a radio frequency signal using the low noise amplifier, the low noise amplifier including first and second inductors magnetically coupled to each other to provide negative feedback to linearize the low noise amplifier, and the low noise amplifier including an amplification circuit configured to receive the radio frequency signal by way of a matching circuit that includes the first inductor;
detecting that a signal level associated with the radio frequency signal is indicative of an overload condition; and
increasing an impedance of a switch coupled to an amplification circuit of the low noise amplifier responsive to said detecting to thereby provide overload protection.

20. The method of claim 19 further comprising selectively connecting an output of an overload protection circuit to an analog control input of the switch.

* * * * *